(12) United States Patent
Yaegashi et al.

(10) Patent No.: US 7,598,522 B2
(45) Date of Patent: Oct. 6, 2009

(54) SEMICONDUCTOR SUBSTRATE AND PRODUCTION PROCESS THEREOF

(75) Inventors: Tetsuo Yaegashi, Kawasaki (JP); Kouichi Nagai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 27 days.

(21) Appl. No.: 11/518,891

(22) Filed: Sep. 12, 2006

(65) Prior Publication Data

US 2007/0007567 A1 Jan. 11, 2007

Related U.S. Application Data

(63) Continuation of application No. PCT/JP2004/005794, filed on Apr. 22, 2004.

(51) Int. Cl.
*H01L 23/58* (2006.01)

(52) U.S. Cl. ............. 257/48; 257/E21.524; 257/E21.53

(58) Field of Classification Search ............... 257/48, 257/E21.524, E21.53
See application file for complete search history.

(56) References Cited

U.S. PATENT DOCUMENTS

| | | | |
|---|---|---|---|
| 6,303,944 B1 | 10/2001 | Sakai et al. | 257/48 |
| 6,410,397 B1 * | 6/2002 | Ochiai et al. | 438/381 |
| 6,602,725 B2 | 8/2003 | Sakai et al. | 438/14 |
| 2002/0014682 A1 | 2/2002 | Sakai et al. | |
| 2003/0039897 A1 | 2/2003 | Morita | |
| 2005/0080506 A1 * | 4/2005 | Asakawa | 700/164 |

FOREIGN PATENT DOCUMENTS

| | | |
|---|---|---|
| JP | 11-219922 | 8/1999 |
| JP | 2000-58611 | 2/2000 |
| JP | 2001-127014 | 5/2001 |
| JP | 2001-332556 | 11/2001 |
| JP | 2002-83792 | 3/2002 |
| JP | 2003-140319 | 5/2003 |
| KR | 1999-71405 | 9/1999 |

* cited by examiner

OTHER PUBLICATIONS

Korean Office Action dated Mar. 11, 2008, for corresponding Korean Patent Application.

*Primary Examiner*—Jerome Jackson, Jr.
*Assistant Examiner*—Paul A Budd
(74) *Attorney, Agent, or Firm*—Kratz, Quintos & Hanson, LLP

(57) ABSTRACT

A semiconductor substrate includes a wafer, a first stepped structure formed of plural stepped parts formed on a surface of the wafer with a first area occupation ratio, a second stepped structure formed of plural stepped parts formed on the surface of the wafer with a second, different area occupation ratio, and an interlayer insulation film formed on the surface so as to cover the first and second stepped structures, the interlayer insulation film having a planarized top surface, wherein there are provided at least first and second film-thickness monitoring patterns for monitoring film thickness on the surface in a manner covered by the interlayer insulation film, a first pattern group is formed on the surface such that the first pattern group comprises plural patterns disposed so as to surround the first film-thickness monitoring pattern, a second pattern group is formed on the surface such that the second pattern group comprises plural patterns disposed so as to surround the second film-thickness monitoring pattern, the first film-thickness monitoring pattern and the first pattern group having a third area occupation ratio on the surface, while the second film-thickness monitoring pattern and the second pattern group having a fourth area occupation ratio on the surface, wherein the third area occupation ratio is different from the fourth area occupation ratio.

6 Claims, 18 Drawing Sheets

30%     80%

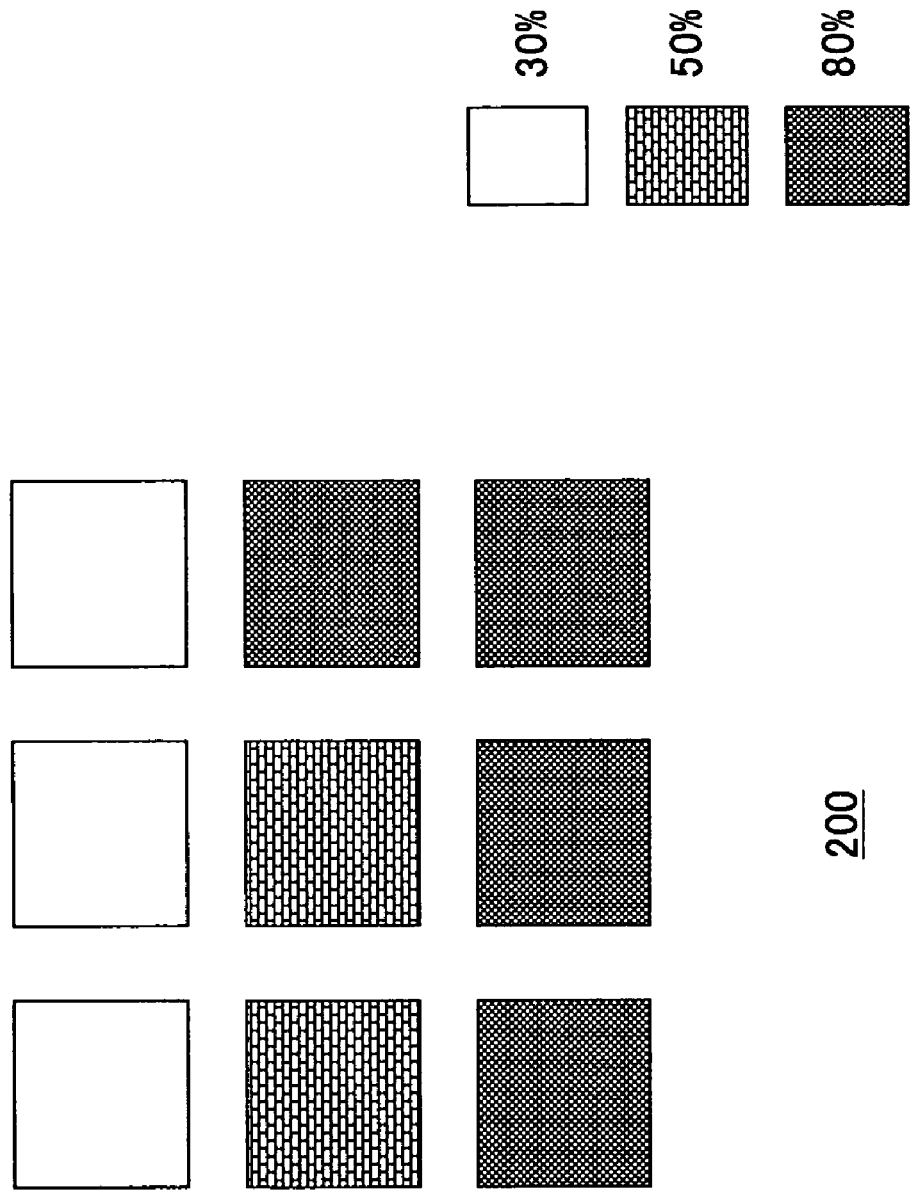

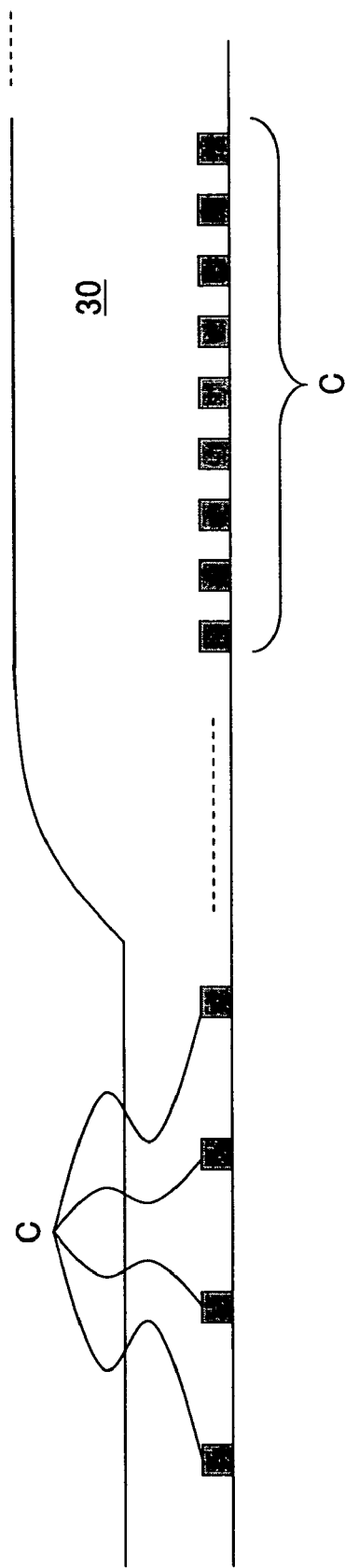

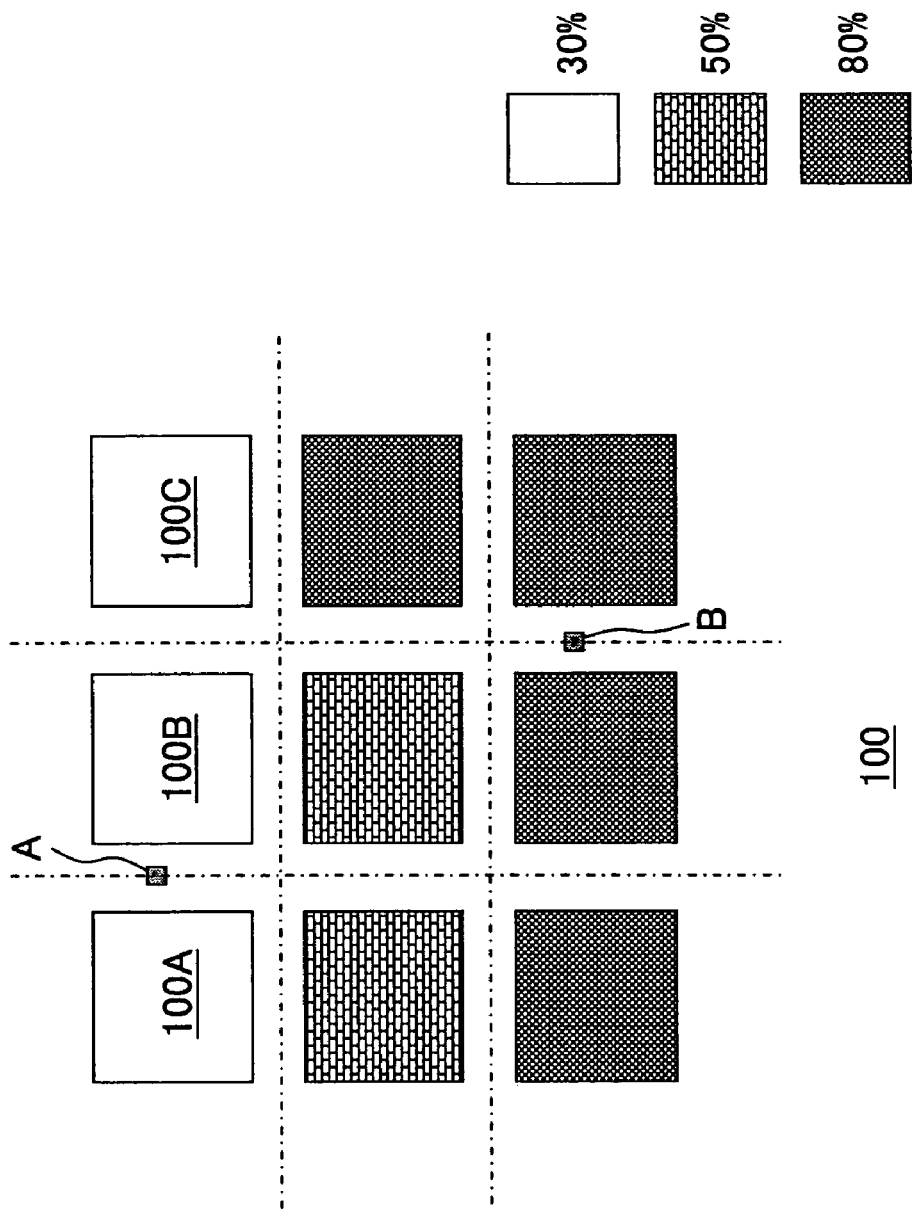

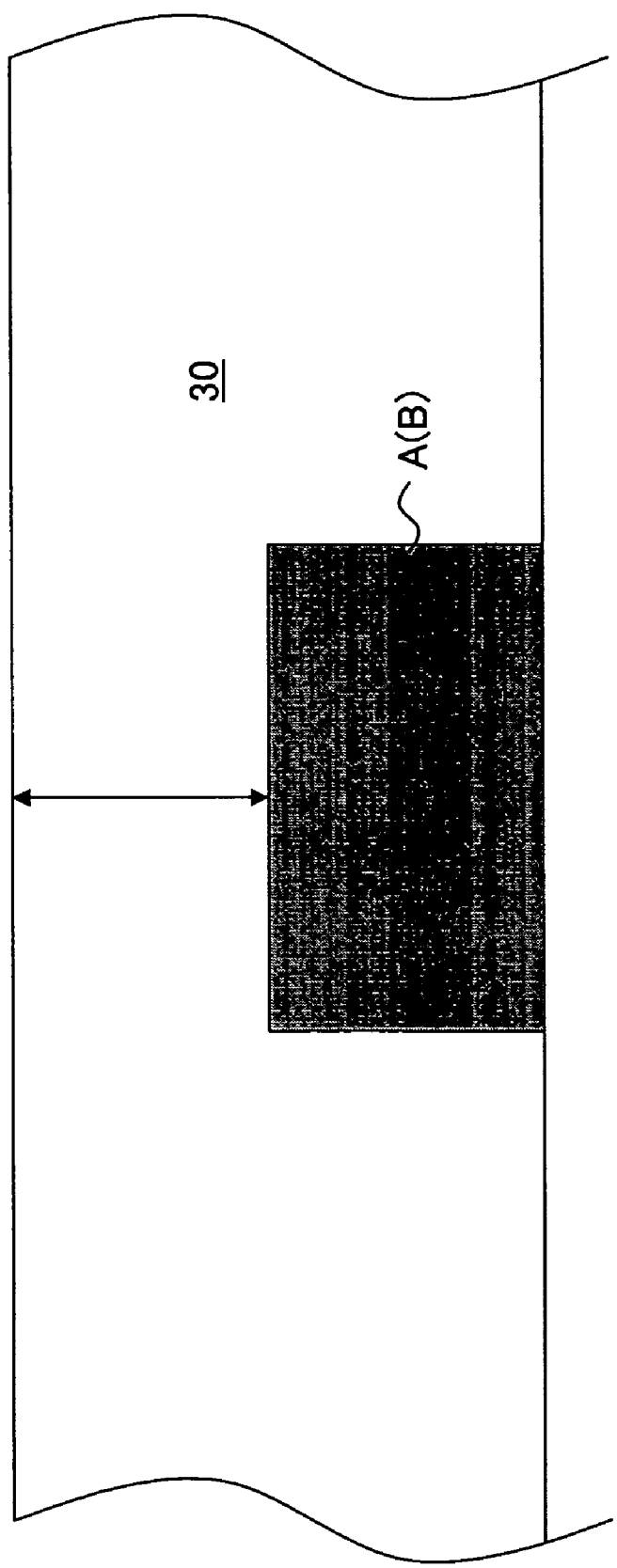

80%

30%

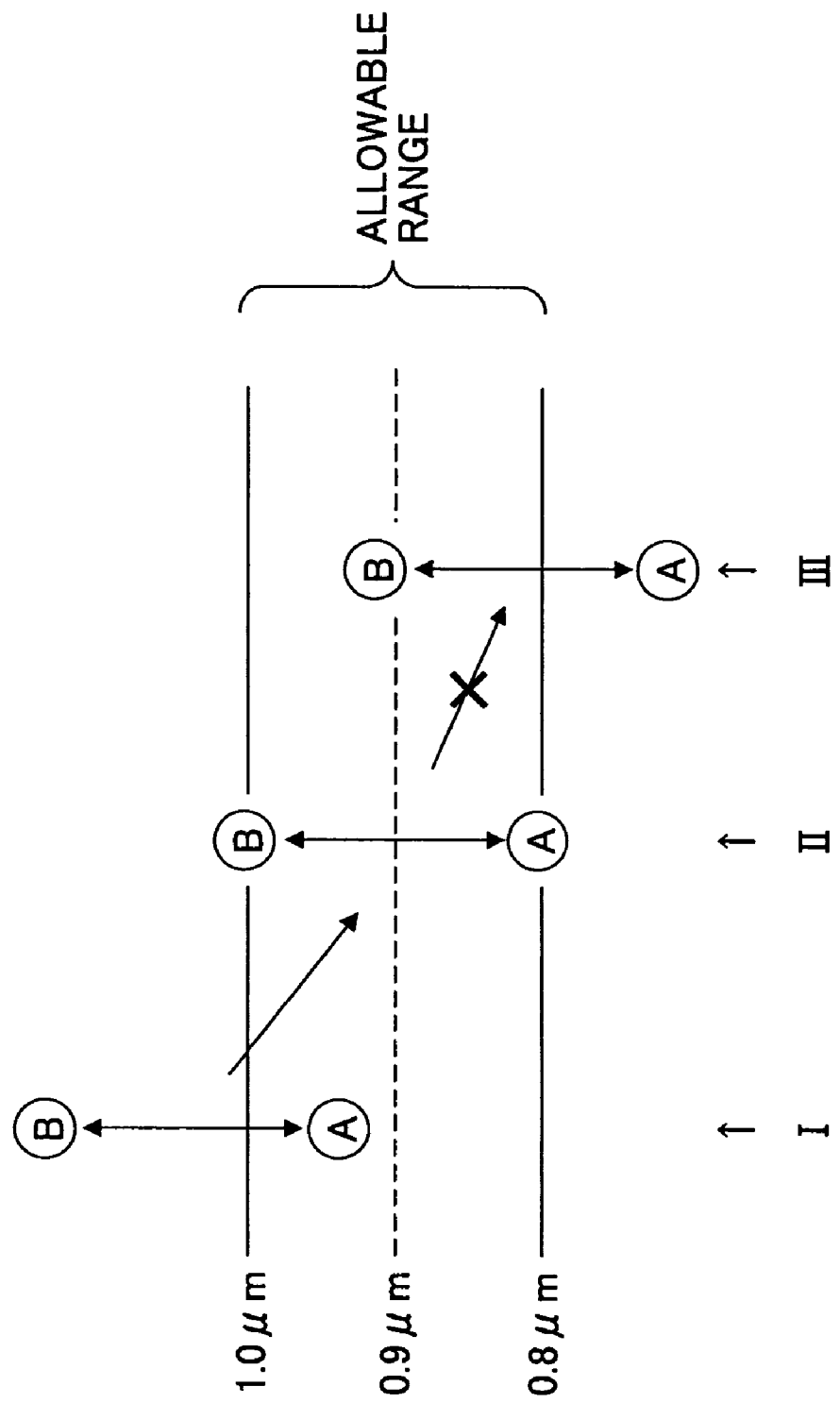

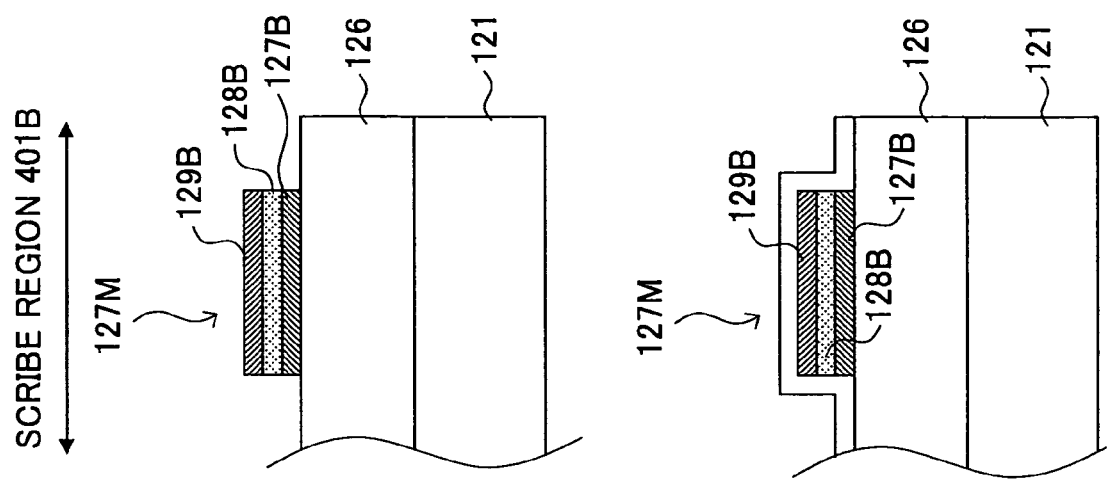
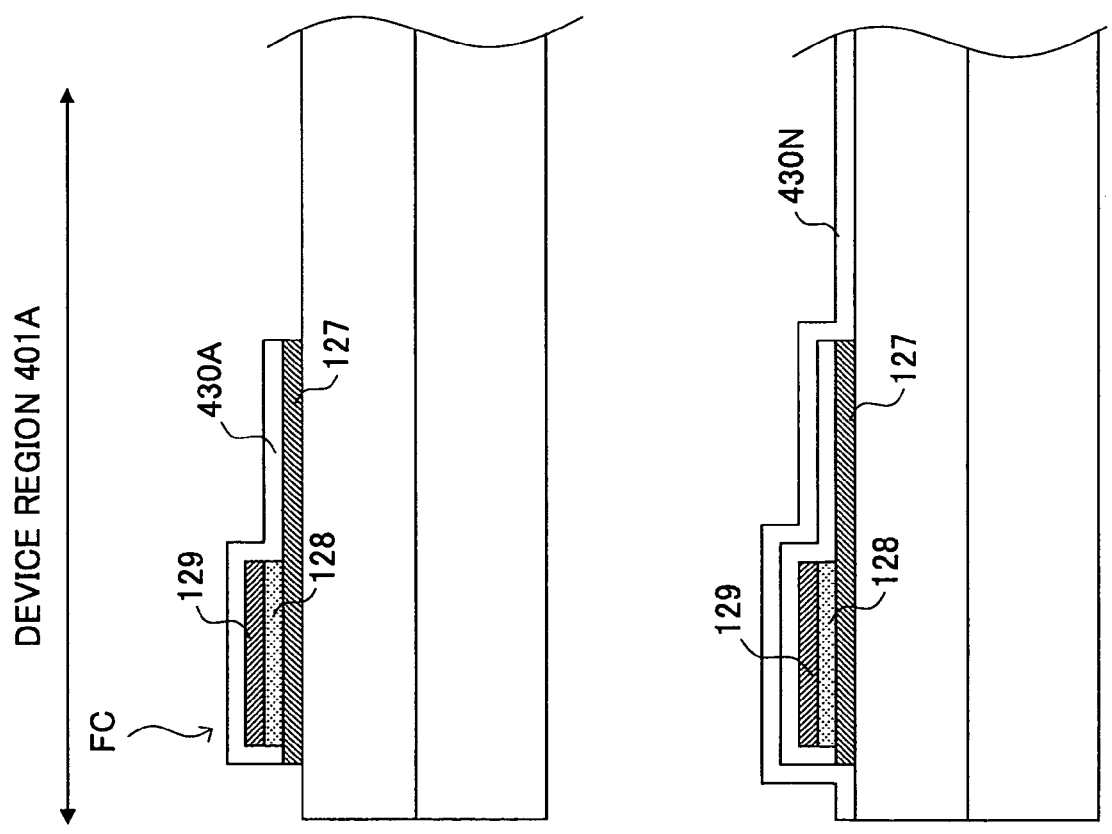
FIG.12E
FIG.12F

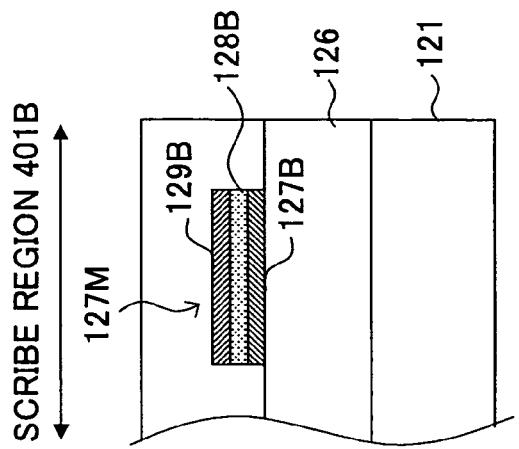
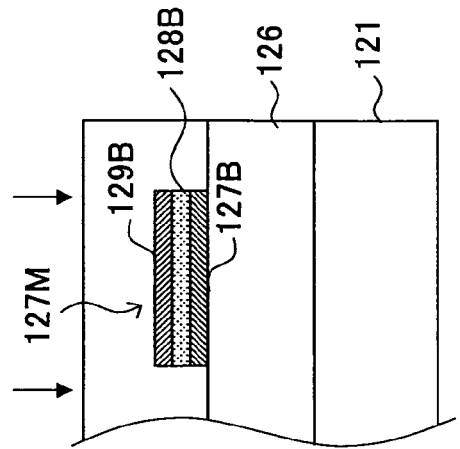
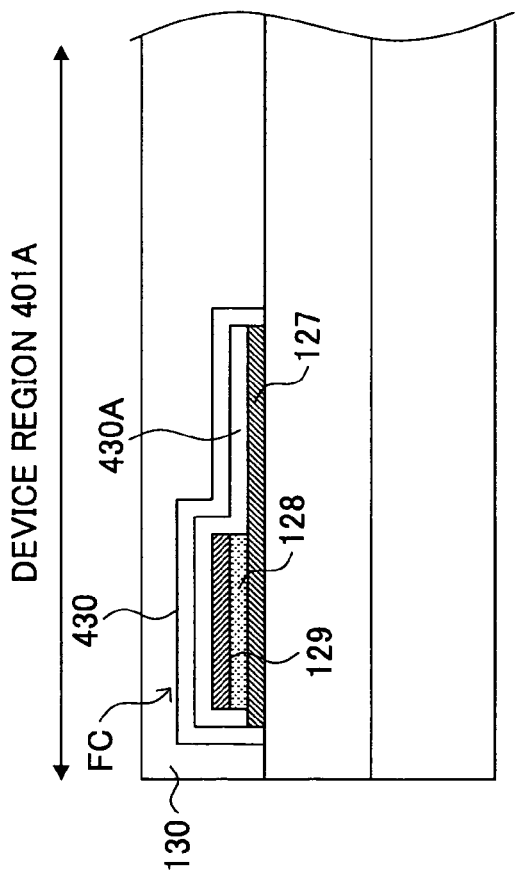
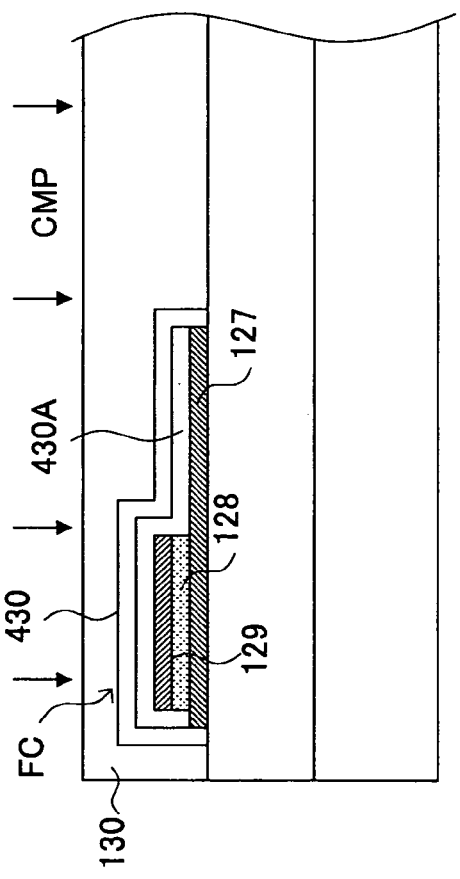
FIG.12G
FIG.12H

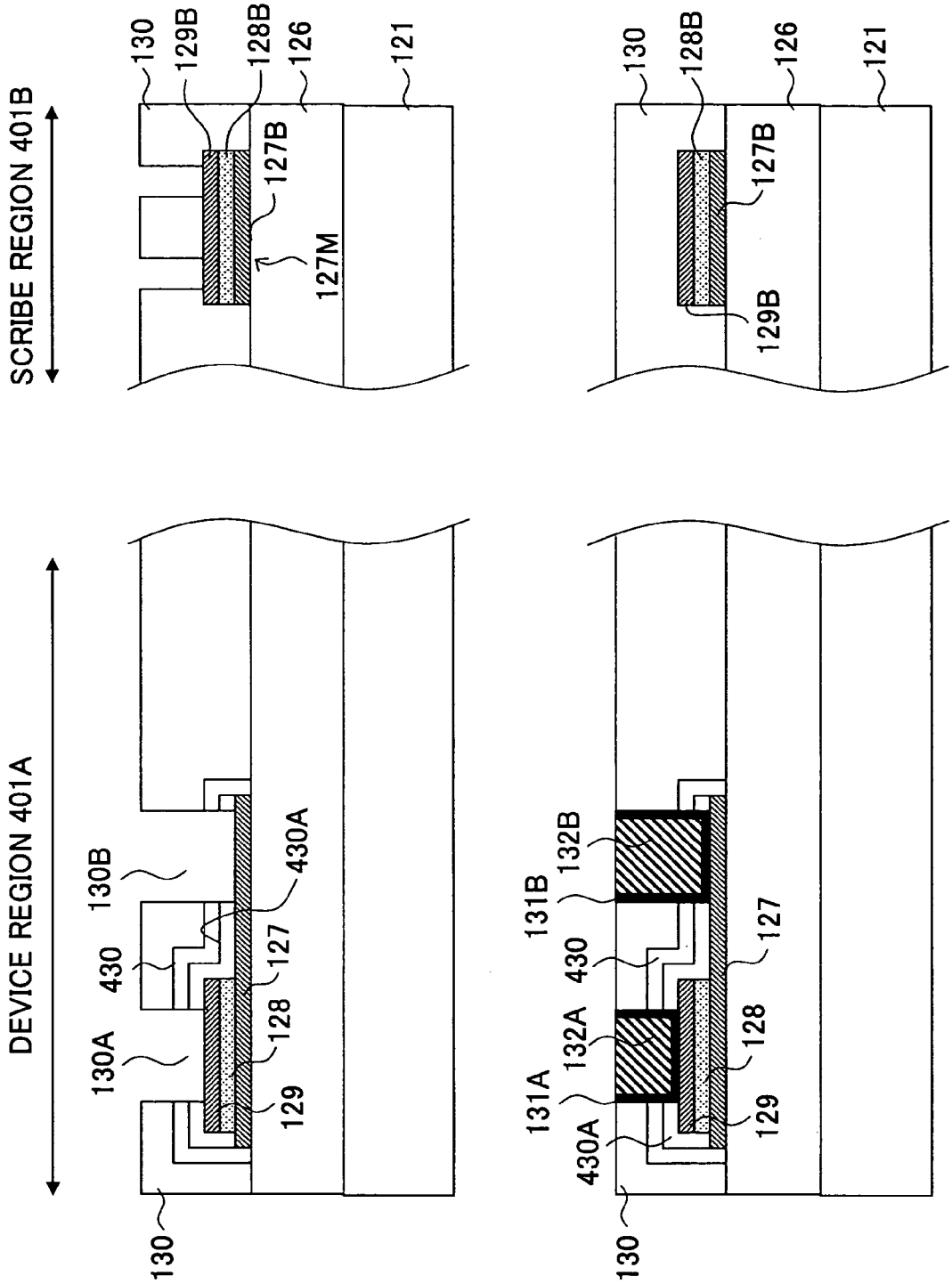

SEMICONDUCTOR SUBSTRATE AND PRODUCTION PROCESS THEREOF

CROSS-REFERENCE TO RELATED APPLICATION

The present invention is a continuation application filed under 35 U.S.C. 111(a) claiming benefit under 35 U.S.C. 120 and 365(c) of PCT application JP2004/005794 filed on Apr. 22, 2004, the entire contents of each are incorporated herein as reference.

BACKGROUND OF THE INVENTION

The present invention generally relates to semiconductor devices and more particularly to a semiconductor device having a ferroelectric film.

Semiconductor storage devices called DRAMs or SRAMs are used extensively as high speed main memory device in information processing apparatuses including computer. However, these devices are volatile storage devices and the information stored therein is lost when the power supply is turned off. In view of this, non-volatile magnetic disk devices have been used as large-capacity auxiliary storage devices for storing programs and data.

However, a magnetic disk unit is mechanically fragile and has problems such as large electric power consumption and slow access speed at the time of reading and writing information.

On the other hand, use of EEPROMs or flash memory devices, which accumulate information in a floating gate electrode in the form of electric charges, is increasing recently for the purpose of non-volatile auxiliary storage devices. Particularly, a flash memory device has a cell construction similar to that of a DRAM and can easily form an integrated circuit of large integration density. Thus, flash memory devices are expected for large capacity storage devices comparable to magnetic disk units.

With EEPROMs or flash memory devices, on the other hand, writing of information is carried out by injection of hot electrons to a floating gate electrode through a tunneling insulation film. Thus, there have been problems that a long time is needed to write information and that the tunneling insulation film tends to cause degradation when writing and erasing of information is repeated. When the tunneling insulation film is degraded, writing or erasing operation becomes unstable and unreliable.

Meanwhile, there is proposed a ferroelectric storage device (referred to hereinafter as FeRAM) that stores information in a ferroelectric film in the form of spontaneous polarization.

With such FeRAMs, each memory cell transistor is formed of a single MOS transistor similarly to the case of a DRAM, except that the dielectric film in the memory cell capacitor is replaced by a ferroelectric such as PZT (Pb (Zr,Ti)$O_3$), PLZT ((Pb,La)(Zr,Ti)$O_3$), SBT (SrBi$_2$Ta$_2$$O_3$), SBTN (SrBi$_2$(Ta, Nb)$_2$$O_3$), and the like. Thus, an FeRAM has a construction suitable for high-density integration.

Further, because an FeRAM controls the spontaneous polarization of the ferroelectric capacitor by application of an electric field, an FeRAM has an advantageous feature of very large writing speed, which reaches as large as 1000 times or more as compared with the case of using an EEPROM or a flash memory device, in which writing is achieved by injection of hot electrons. Further, an FeRAM has an advantageous feature of low electric power consumption, which can be reduced to 1/10 times or less as compared with the case of using an EEPROM or a flash memory device.

Further, in view of elimination of tunneling oxide film, an FeRAM has an advantageous feature of long lifetime, and thus, it is excepted that the number of rewriting information can be increased by 100,000 times as large as in the case of repeating rewriting of information with a flash memory device.

Patent Reference 1
Japanese Laid-Open Patent Application 11-219922 official gazette

SUMMARY OF THE INVENTION

FIG. 1 shows the construction of a conventional FeRAM 20.

Referring to FIG. 1, the FeRAM 20 is constructed on a silicon substrate 21 of p-type or n-type formed with a p-type well 21A and an n-type well 21B by a field insulation film 22, wherein a gate electrode 24A of polycide structure is formed on the p-type well 21A via a gate insulation film 23A. Further, a gate electrode 24B of polycide structure is formed on the n-type well 21B via a gate insulation film 23B.

Further, there are formed n-type diffusion regions 21a and 21b in the p-type well 21A at respective lateral sides of the gate electrode 24A, while there are formed p-type diffusion regions 21c and 21d in the n-type well 21B at respective lateral sides of the gate electrode 24B. The gate electrode 24A extends over the field oxide film 22 in the region outside the active region and forms a part of the word line (WL) of the FeRAM 20.

Each of the gate electrodes 24A and 24B carries respective sidewall insulation films and is covered by an SiON cover film 25 having a thickness of about 200 nm, wherein the SiON cover film 25 may be formed on the Si substrate 21 by a CVD process so as to cover the field insulation film 22.

The SiON film 25 is further covered by an $SiO_2$ interlayer insulation film 26 formed by a CVD process with the thickness of about 1 μm while using a TEOS gas as the source, and the surface of the interlayer insulation film 26 is planarized by a CMP process.

On the planarized surface of the interlayer insulation film 26, there is formed a ferroelectric capacitor having a construction in which a lower electrode 27, formed of lamination of a Ti film having a thickness of 10-30 nm, preferably about 20 nm and a Pt film having a thickness of 100-300 nm, preferably about 175 nm, a ferroelectric capacitor insulation film 28 of PZT (Pb(Zr,Ti)$O_3$) or PLZT ((Pb,La)(Zr,Ti)$O_3$) having a thickness of 100-300 nm, preferably about 240 nm, and an upper electrode 29 of IrOx having a thickness of 100-300 nm, preferably about 200 nm, are stacked consecutively.

Typically, the Ti film and the Pt film are formed by a sputtering process, while the ferroelectric capacitor insulation film 28 is formed by a sputtering process, followed by a rapid thermal annealing process conducted in an oxygen gas ambient at 725° C. for 20 seconds.

Preferably, the ferroelectric film 28 is added with Ca and Sr and may be formed also by processes other than sputtering, such as spin-on process, sol-gel process, MOD (metal organic deposition) process, MOCVD process, or the like. Further, for the ferroelectric capacitor insulation film 28, it is possible to use, in addition to PZT or PLZT, the films of SBT (SrBi$_2$(Ta,Nb)$_2$$O_9$), BTO (Bi$_4$Ti$_2$$O_{12}$), and the like. Further, it is possible to form a DRAM is as well by using a high-K dielectric film such as BST ((Ba,Sr)TiO$_3$) or STO (SrTiO$_3$) in place of the ferroelectric capacitor insulation film 28. Typically, the IrOx film forming the upper electrode 29 is formed
} by sputtering. Further, it is possible to use a Pt film or an SRO (SrRuO$_3$) film for the upper electrode 29 in place of the IrOx film.

Meanwhile, with the ferroelectric capacitor thus formed, there easily occurs reduction in the ferroelectric capacitor insulation film 28 when the ferroelectric capacitor insulation film is exposed to a reducing ambient, especially a hydrogen gas ambient associated with semiconductor process. Thereby, there is caused sever deterioration in the electric performance.

Because of this, the ferroelectric capacitor thus formed is covered by an encap layer 330A of Al$_2$O$_3$ of the thickness of about 50 nm formed by sputtering at an ordinary temperature. Further, the encap layer 330A is covered by another Al$_2$O$_3$ encap layer 330 formed on the interlayer insulation film 26 by sputtering with the thickness of about 20 nm. Here, it should be noted that the Al$_2$O$_3$ encap layer 330 functions as a barrier film that prevents penetration of hydrogen.

On the encap layer 330, there is formed an SiO$_2$ interlayer insulation film 30 by a CVD process, preferably plasma CVD process, while using SiH$_4$, a polysilane compound such as Si$_2$F$_6$, Si$_3$F$_8$, Si$_2$F$_3$Cl, or the like, or SiF$_4$ or TEOS for the source material, with a thickness of about 400 nm over the upper electrode 29.

In the interlayer insulation film 30, there are formed contact holes 30A and 30B exposing the upper electrode 29 and the lower electrode 27 respectively. Further, there are formed contact holes 30C, 30D, 30E and 30F respectively exposing the diffusion regions 21$a$, 21$b$, 21$c$ and 21$d$ such that the contact holes 30C, 30D, 30E and 30F extend through the interlayer insulation film 26. Further, there is formed a contact hole 30G in the interlayer insulation film 30 so as to expose the word line pattern WL formed on the device isolation film 22.

With the conventional FeRAM 20 of FIG. 1, there are formed adhesion films 31A and 31B of a conductive nitride such as TiN respectively in the contact holes 30A and 30B with a thickness of about 50 nm so as to make a direct contact with the inner wall surface of the respective contact holes and so as to make a direct contact with the exposed surface of the upper electrode 29 or the lower electrode 27.

Further, in the contact hole 30A, there is formed a conductive plug 32A of W on the TiN adhesion layer 31A, and in the contact hole 30B, there is formed a conductive plug 32B of W on the TiN adhesion layer 31B, wherein the conductive plugs 32A and 32B are formed by a CVD process that uses a mixed gats of WF$_6$, Ar and H$_2$.

Further, with the FeRAM 20, there are formed Ti/TiN adhesion layers 31C-31G on the inner wall surfaces of the contact holes 30C-30G, respectively, and the W plugs 32C-32G are formed respectively on the Ti/TiN adhesion layers 31C-31G so as to fill the respective contact holes.

Further, there are formed interconnection patterns 33A-33F of Al on the interlayer insulation film 30 respectively in correspondence to the W plugs 32A-32G, wherein the interconnection patterns 33A-33F are covered by a next interlayer insulation film 34 of an SiO$_2$ film formed by a plasma CVD process. Similarly to the interlayer insulation film 30, the interlayer insulation film 34 can be formed by using SiH$_4$, a polysilane compound of Si$_2$F$_6$, Si$_3$F$_8$, Si$_2$F$_3$Cl, and the like, or SiF$_4$, or TEOS as a source material.

Further, a protective insulation film 35 of SiO$_2$ is formed on the interlayer insulation film 34 by a plasma CVD process with the thickness of 100 nm or more. The protective insulation film 35 thus covers a slit (void) exposed by the planarization process (CMP) conducted after the formation of the interlayer insulation film 34.

Further, contact holes 35A and 35B are formed in the protective insulation film 35 to as to penetrate through the interlayer insulation film 34 and so as to expose the interconnection patterns 33A and 33F respectively, and W plugs 37A and 37B are formed on the inner wall surfaces of the contact holes 35A and 35B through the TiN adhesive layers 36A and 36B.

Further, interconnection patterns 38A and 38B of Al or Al alloy are formed on the protective insulation film 35 respectively in contact with the W plugs 37A and 37B. Thereby, the TiN adhesion films 36A and 36B, covering the inner wall surfaces of the contact holes 35A and 35B, extend further between the protective insulation film 35 and the interconnection pattern 38A and between the protective insulation film 35 and the interconnection pattern 38B.

Further, the interconnection patterns 38A and 38B are covered by an interlayer insulation film 39 formed similarly to the interlayer insulation films 30 and 34, wherein the interlayer insulation film is covered by a protective insulation film 40 similar to the protective insulation film 35 and interconnection patterns 41A-41E including therein a bit line (BL) pattern are formed on the protective film 40.

The FeRAM 20 of FIG. 1 is fabricated by the process of FIGS. 2A-2F.

Referring to FIG. 2A, an SiO$_2$ interlayer insulation film 26 is formed on the Si substrate 21 formed therein with the diffusion regions 21$a$-21$d$ and carrying thereon the polycide gate electrodes 24A and 24B, such that the SiO$_2$ interlayer insulation film 26 covers the gate electrodes 24A and 24B with a thickness of about 1 μm by a plasma CVD process that uses TEOS as a source material.

Further, after planarizing the interlayer insulation film 26 by a CMP process, a Ti film and a Pt film are deposited consecutively with respective thicknesses of 20 nm and 175 nm, and a ferroelectric film of PLZT, or the like, preferably doped with Ca and Sr as noted before, is formed thereon by a sputtering process with a thickness of about 240 nm. The PLZT film thus formed is crystallized by a rapid thermal annealing process conducted in an oxygen gas ambient at 725° C. for 20 seconds while using the temperature elevation rate of 125° C./second.

Further, an IrOx film is formed on the ferroelectric film, after the crystallization process thereof, by a sputtering process with a thickness of 200 nm.

The upper electrode 29 is formed by patterning the IrOx film thus formed by a resist process.

After the resist process, the ferroelectric film is annealed once again in an oxygen gas ambient at 650° C. for 60 seconds, and with this, the defects introduced to the ferroelectric film during the sputtering process and patterning process of the IrOx film is compensated.

Next, a resist pattern is formed so as to include the upper electrode 29, and the ferroelectric capacitor insulation film 28 is formed by patterning the ferroelectric film while using the resist pattern as a mask.

After formation of the ferroelectric capacitor insulation film 28, dehydration of the interlayer insulation film 26 is conducted by carrying out a thermal annealing process in a nitrogen gas ambient.

Further en encap layer 330 is formed for protecting the ferroelectric capacitor insulation film 28 from H$_2$ by sputtering an Al$_2$O$_3$ film on the Pt/Ti layer at ordinary temperature so as to cover the ferroelectric capacitor insulation film 28 and the upper electrode 29.

After formation of the encap layer 330A, a thermal annealing process is conducted in an oxygen gas ambient at the temperature of 550° C. for 60 seconds for improving the quality of the encap layer 330A.

Further, a resist pattern is formed on the encap layer 330A thus formed, and the lower electrode 27 is formed by patterning the Pt/Ti layer while using the resist pattern as a mask.

Further, the resist pattern used for the patterning of the lower electrode 27 is removed, and thermal annealing is conducted at 350° C. for 30 seconds. Further, a second encap layer 330 is formed so as to cover the encap layer 330A by sputtering an $Al_2O_3$ film on the interlayer insulation film 26.

Further, in the step of FIG. 2A, a thermal annealing process is conducted, after formation of the encap layer 330, in an oxygen gas ambient at 650° C. for 30 seconds, and the damages introduced into the ferroelectric capacitor insulation film 38 are eliminated.

Further, an interlayer insulation film 30 is formed on the encap layer 330 by a plasma CVD process with a thickness of about 1200 nm while using $SiH_4$, a polysilane compound such as $Si_2F_6$, $Si_3F_8$, $Si_2F_3Cl$, and the like, or $SiF_4$.

The interlayer insulation film 30 may be formed by using TEOS as the source material. Further, it is also possible to use pyrolitic CVD process or laser-enhanced CVD process, in place of the plasma CVD process.

The interlayer insulation film 30 thus formed is planarized by a polishing process conducted by a CMP process until the thickness thereof measured from the surface of the upper electrode 29 becomes about 400 nm.

Next, in the step of FIG. 2B, dehydration processing of the interlayer insulation film 30 is conducted by using $N_2$ plasma or $N_2O$ plasma, and contact holes 30A and 30B are formed in the interlayer insulation film 30 by using a resist process that uses a mixed gas of $CHF_3$, $CF_4$ and Ar, such that the contact holes 30A and 30B extend through the encap layers 330 and 330A and expose the upper electrode 29 and the lower electrode 27, respectively.

Further, in the step of FIG. 2B, the structure thus formed is annealed in an oxygen gas ambient at 550° C. for 60 hours for the purpose of curing the ferroelectric capacitor insulation film 28 with regard to the deterioration of film quality caused by the formation of the contact holes 30A and 30B.

Next, in the step of FIG. 2C, a resist pattern R is formed on the structure of FIG. 2B such that the resist pattern R includes openings corresponding to the contact holes 30C-30F, and the contact holes 30C-30F are formed so as to expose the diffusion regions 21a-21d by patterning the interlayer insulation films 30 and 26 while using the resist pattern R as a mask. In FIG. 2C, and also in the description hereinafter, it should be noted that the contact hole 30G shown in FIG. 1 is omitted for the purpose of simplicity.

Next, in the step of FIG. 2D, the resist pattern R is removed and, after conducting a preprocessing by an Ar plasma etching process, a TiN film 31 is formed on the interlayer insulation film 30 by a sputtering process with a thickness of about 50 nm, such that the TiN film 31 covers the inner wall surface and the bottom surface of the contact hole 31A continuously and such that the TiN film 31 covers the inner wall surface and the bottom surface of the contact hole 31B continuously. The TiN film 31 thus formed makes a contact with the exposed part of the upper electrode 29 at the bottom surface of the contact hole 31A and makes a contact with the exposed part of the lower electrode 27 at the bottom surface of the contact hole 31B. Further, the TiN film 31 makes a contact with the exposed diffusion regions 21a-21d at the contact holes 30C-30F.

Next, in the step of FIG. 2E, a W layer 32 is formed on the structure of FIG. 2D by a CVD process that uses a $WF_6$ gas, an Ar gas and a hydrogen gas, such that the W layer 32 fills the contact holes 30C-30F via the TiN film 31.

In the step of FIG. 2E, it should be noted that the hydrogen gas is used in the CVD process of the W layer 32, while it should be noted that the hydrogen gas does not reach the ferroelectric film 28 because of the fact that the entire ferroelectric capacitor including the ferroelectric film 28 is covered continuously by the encap layers 330, 330A and the TiN film 31, and thus, there occurs no problem of degradation of performance of the ferroelectric capacitor caused by reduction.

Next, in the step of FIG. 2F, the W layer 32 on the interlayer insulation film 30 is removed by a CMP process, and W plugs 32A-32F are formed by the parts of the W layer remaining in the contact holes 30A-30F. Further, as a result of such a CMP process, the TiN film 31 is planarized also, and there are formed TiN patterns 31A-31F in correspondence to the contact holes 30A-30F, respectively.

Among the W plugs 32A-32F thus formed, it should be noted that the W plug 32A makes a contact with the upper electrode 29 of IrOx via the TiN pattern 21A, wherein the TiN pattern 31A does not cause reaction with a conductive oxide such as IrOx, and thus, there is caused no increase of contact resistance.

Further, a multilayer interconnection structure is formed on the structure of FIG. 2F by an ordinary process, and with this, the FeRAM 20 of FIG. 1 is obtained.

With the FeRAM 20 of such a construction, the lower electrode 27 and the ferroelectric capacitor insulation film 28 are formed typically with a thickness of about 200 nm. Further, the upper electrode 29 is formed to a thickness of about 250 nm. Thus, the ferroelectric capacitor has a height of about 650 nm on the interlayer insulation film 26.

Thus, it is practiced in the art to form the interlayer insulation film 30, at the time of covering the ferroelectric capacitor by the interlayer insulation film 30 in advance of the step of FIG. 2A, with a very large thickness, typically the thickness of about 2.6 μm, such that it becomes possible to planarize the surface of the interlayer insulation film 30 as much as possible.

In such a case, however, there is a need of polishing the interlayer insulation film 30 by a CMP process to the extent of as much as 1.6 μm in order to attain the desired state of FIG. 2A.

In the case of fabricating the FeRAM 20 of FIG. 1, on the other hand, it should be noted that the foregoing CMP process is conducted in the state in which the FeRAM 20 is already formed on the semiconductor wafer, and thus, various FeRAM chips 201-20$_N$ each including the FeRAM 20 with plural numbers are formed on the semiconductor wafer 200 as represented in FIG. 3.

Thus, the desired FeRAM is produced by dicing the semiconductor wafer 200 into individual chips along the scribe lines.

In the fabrication process of FeRAM, on the other hand, there can be a case in which integration density of the FeRAM 20 is different between the chips although the chips themselves are formed commonly on the same wafer 200. For example, there can be a case in which there are formed the chips of three different types, the one in which the memory cells occupy 30% of the chip area, the one in which the memory cells occupy 50% of the chip area, and the one in which the memory cells occupy 80% of the chip area, in a region of the semiconductor wafer 200 exposed by the same reticle with close positional relationship.

With the construction in which different FeRAM chips having different area occupation ratios for the ferroelectric capacitors are formed on the same substrate, it will be noted that the interlayer insulation film 30 is formed with a reduced thickness when the interlayer insulation film is formed in the chip regions where the density of the ferroelectric capacitors C is small and thus the area occupation ratio is small, by filling the space between the projecting ferroelectric capacitors C as shown in FIG. 5. In the chip regions where the ferroelectric capacitors C are formed with higher density, on the other hand, the space available for the interlayer insulation film 30 is reduced, and thus, the interlayer insulation film 30 is formed with a larger film thickness as indicated also in FIG. 5. In FIG. 5, it should be noted that the ferroelectric capacitor C has the same construction to the ferroelectric capacitor C of FIG. 1.

Thus, when the thickness of the interlayer insulation film 30 is reduced to a predetermined film thickness by applying a CMP process to such a structure while monitoring the film thickness thereof by optical means while using a film-thickness monitoring pattern, there arises a problem in that the interlayer insulation film 30 thus polished may have a thickness larger than the foregoing predetermined thickness in the regions where the interlayer insulation film 30 has a large initial thickness when the film-thickness monitoring pattern is formed in the vicinity of the chip region where the initial thickness of the interlayer insulation film 30 is small, even in the case the CMP process itself is controlled properly by using the film-thickness monitoring pattern. Thus, there can be a case in which the dry etching process, conducted for forming the openings 30A and 30B in the interlayer insulation film in the step of FIG. 2B so as to expose the upper electrode 29 or the lower electrode 27, does not reach the desired electrodes.

Conversely, there can be a case in which the polishing of the interlayer insulation film 30 becomes excessive in the region where the initial film thickness of the interlayer insulation film 30 is small when the CMP process is controlled by monitoring the film thickness of such a film-thickness monitoring pattern disposed in the vicinity of the region where the initial thickness of the interlayer insulation film 30 is large.

Thus, these problems are thought to be caused as a result of conducting a CMP process to the substrate that includes therein regions where the ferroelectric capacitors are formed with different area occupation ratios while controlling the film thickness by using a single film-thickness monitoring pattern.

This problem may be eliminated by providing plural film-thickness monitoring patterns of different thicknesses for monitoring the film thickness according to the density of the ferroelectric capacitors. However, such formation of film-thickness monitoring patterns with different heights is generally difficult. Further, such a film-thickness monitoring pattern for film thickness monitoring is usually disposed automatically to a suitable region on the scribe line at the time of designing of the semiconductor integrated circuit, and it is difficult to form such film-thickness monitoring patterns at desired locations according to the formation density of the ferroelectric capacitors.

Further, while it may be conceivable to carry out measurement of film thickness by using the ferroelectric capacitor itself without using a film-thickness monitoring pattern, measurement of film thickness by way of optical means requires a flat surface area of certain size, and such an approach is not practical for the actual film thickness monitoring of ferroelectric capacitors carried out in a production line of semiconductor devices.

In a first aspect of the present invention, there is provided a semiconductor substrate, comprising:

a wafer;

a first stepped structure comprising plural stepped parts formed on a surface of said wafer with a first area occupation ratio;

a second stepped structure comprising plural stepped parts formed on said surface of said wafer with a second, different area occupation ratio; and an interlayer insulation film formed on said surface so as to cover said first and second stepped structures, said interlayer insulation film having a planarized top surface, wherein there are provided at least first and second film-thickness monitoring patterns for monitoring film thickness on said surface in a manner covered by said interlayer insulation film, a first pattern group is formed on said surface such that said first pattern group comprises plural patterns disposed so as to surround said first film-thickness monitoring pattern, a second pattern group is formed on said surface such that said second pattern group comprises plural patterns disposed so as to surround said second film-thickness monitoring pattern, said first film-thickness monitoring pattern and said first pattern group having a third area occupation ratio on said surface, while said second film-thickness monitoring pattern and said second pattern group having a fourth area occupation ratio on said surface, wherein said third area occupation ratio is different from said fourth area occupation ratio.

In another aspect, the present invention provides a method of fabricating a semiconductor device, said semiconductor device, said semiconductor device comprising: a wafer; a first stepped structure comprising plural stepped parts formed on a surface of said wafer with a first area occupation ratio; a second stepped structure comprising plural stepped parts formed on said surface of said wafer with a second, larger area occupation ratio; and an interlayer insulation film formed on said surface so as to cover said first and second stepped structures, said method comprising the step of:

polishing said interlayer insulation film by a chemical mechanical polishing process, wherein said chemical mechanical polishing process is conducted by using, for monitoring a film thickness of said interlayer insulation film, a first film-thickness monitoring pattern formed on said surface in a manner surrounded with plural patterns with a third area occupation ratio substantially identical to said first area occupation ratio and a second film-thickness monitoring pattern formed on said surface in a manner surrounded with plural patterns with a fourth area occupation ratio substantially identical to said second area occupation ratio.

According to the present invention, it becomes possible, in the fabrication process of a semiconductor device carrying thereon plural stepped structures with different area occupation ratios, the fabrication process including the step of polishing an interlayer insulation film covering such stepped structures by a chemical mechanical polishing process, to control the film thickness of the interlayer insulation film after polishing, by using at least two film-thickness monitoring patterns of different area occupation ratios, in view of the fact that there is caused deposition of the interlayer insulation film on the respective film-thickness monitoring patterns with thicknesses equal to the thicknesses of the interlayer insulation film actually deposited on the foregoing plural stepped structures.

In another aspect, the present invention provides a semiconductor substrate, comprising:

a wafer;

a first stepped structure formed on a surface of said wafer with a fist area occupation ratio;

a second stepped structure formed on said surface of said wafer with a second, different area occupation ratio; and an interlayer insulation film formed on said surface of said wafer so as to cover said first and second stepped structures, said interlayer insulation film having a planarized top surface, said substrate carrying, on said surface, at least one film-thickness monitoring pattern for monitoring a film thickness of said interlayer insulation film in a state covered by said interlayer insulation film, said surface carrying a pattern group formed of plural patterns surrounding said film-thickness monitoring pattern.

In another aspect, the present invention provides a method for fabricating a semiconductor device, said semiconductor device comprising: a wafer; a first stepped structure comprising plural stepped parts formed on a surface of said wafer with a first area occupation ratio; a second stepped structure comprising plural stepped parts formed on said surface with a second, larger area occupation ratio; and an interlayer insulation film formed on said surface so as to cover said first and second stepped structures, wherein a film-thickness monitoring pattern monitoring a film thickness of said interlayer insulation film is formed on said surface together with other patterns to have an area occupation ratio substantially equal to said second area occupation ratio, said method comprising the step of polishing said interlayer insulation film by a chemical mechanical polishing process, said polishing step being conducted by using said film-thickness monitoring pattern such that said interlayer insulation film has a thickness not exceeding an allowable upper limit thickness.

In a further aspect, the present invention provides a method for fabricating a semiconductor device, said semiconductor device comprising: a wafer; a first stepped structure comprising plural stepped parts formed on a surface of said wafer with a first area occupation ratio; a second stepped structure comprising plural stepped parts formed on said surface with a second, larger area occupation ratio; and an interlayer insulation film formed on said surface so as to cover said first and second stepped structures, wherein a film-thickness monitoring pattern monitoring a film thickness of said interlayer insulation film is formed on said surface together with other patterns to have an area occupation ratio substantially equal to said first area occupation ratio, said method comprising the step of polishing said interlayer insulation film by a chemical mechanical polishing process, said polishing step being conducted by using said film-thickness monitoring pattern such that said interlayer insulation film has a thickness not smaller than an allowable lower limit thickness.

According to the present invention, it becomes possible to correspond the area occupation ratio of the region that includes the film-thickness monitoring pattern with the area occupation ratio of the part of the interlayer insulation film that is critical to the film thickness control, by forming a pattern group including plural patterns such that the plural patterns surround the film-thickness monitoring pattern. Thus, it becomes possible with the present invention to control the film thickness of the interlayer insulation film deposited on such a film-thickness monitoring pattern such that the film thickness of the interlayer insulation film falls in a desired thickness range.

Other objects and further features of the present invention will become apparent from the following detailed description when read in conjunction with the attached drawings.

BRIEF DESCRIPTION OF THE DRAWINGS

FIG. 4 is a diagram for explaining the object of the present invention;

FIG. 5 is another diagram for explaining the object of the present invention;

FIG. 6 is a diagram for explaining a first embodiment of the present invention;

FIG. 7 is a cross-sectional diagram explaining the film-thickness monitoring pattern in FIG. 6;

FIG. 9 is a diagram explaining the optimization of the CMP process according to a first embodiment of the present invention;

FIGS. 12A-12J are diagrams showing the fabrication process of the FeRAM of the second embodiment of the present invention.

DETAILED DESCRIPTION OF THE PREFERRED EMBODIMENT

First Embodiment

FIG. 6 is a plan view diagram showing a part 100 of a semiconductor wafer according to an embodiment of the present invention.

Figure 1:
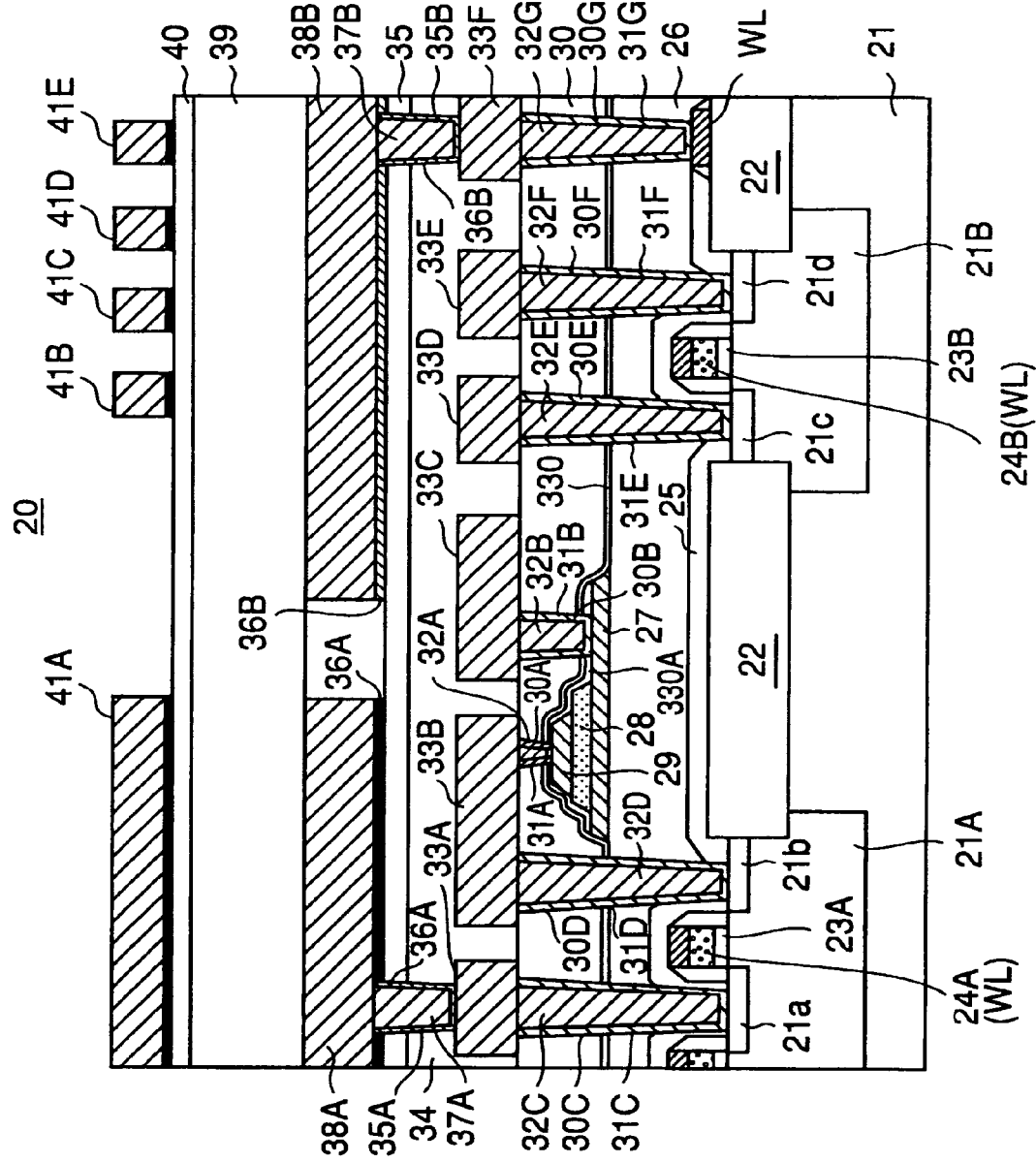
FIG. 1 is a diagram showing the construction of a conventional FeRAM in a cross-sectional view.

Referring to FIG. 6, there are formed plural chip regions 100A, 100B, 100 C . . . , on a semiconductor wafer 100 by scribe lines 101, and each chip region includes a memory cell region in which a large number of FeRAMs, each having a construction similar to that of FIG. 1, are formed, wherein it should be noted that there exist, on the wafer 100, chip regions of different area occupation ratios for the ferroelectric capacitors. In the illustrated example, there exist a chip region with the area occupation ratio of 30%, a chip region with the area occupation ratio of 50%, and the chip region with the area occupation ratio of 80%.

Here, it should be noted that "area occupation ratio" is defined as the ratio of the area occupied by plural ferroelectric capacitors in a chip region defined by the scribe lines 101 to the area of the chip region.

Figure 2A:
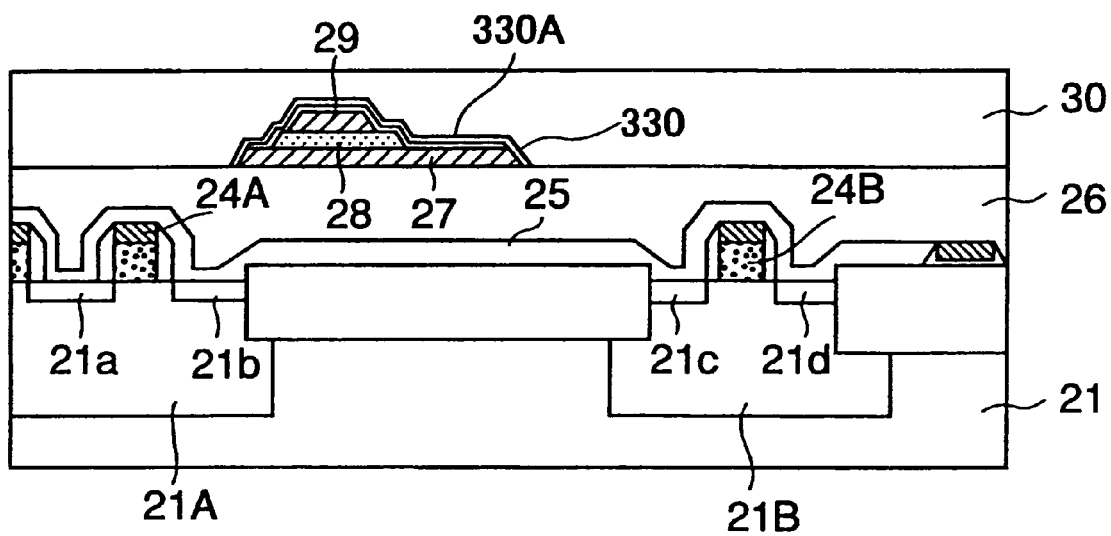
FIGS. 2A-2F are diagrams showing the fabrication process of the FeRAM of FIG. 1.
Figure 2B:
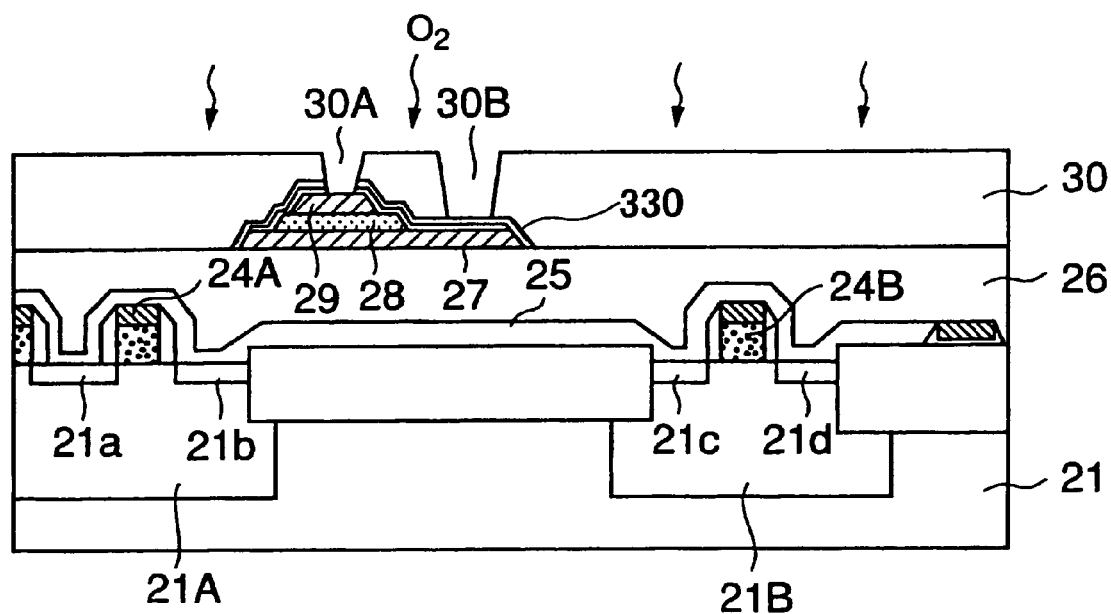
Figure 2C:
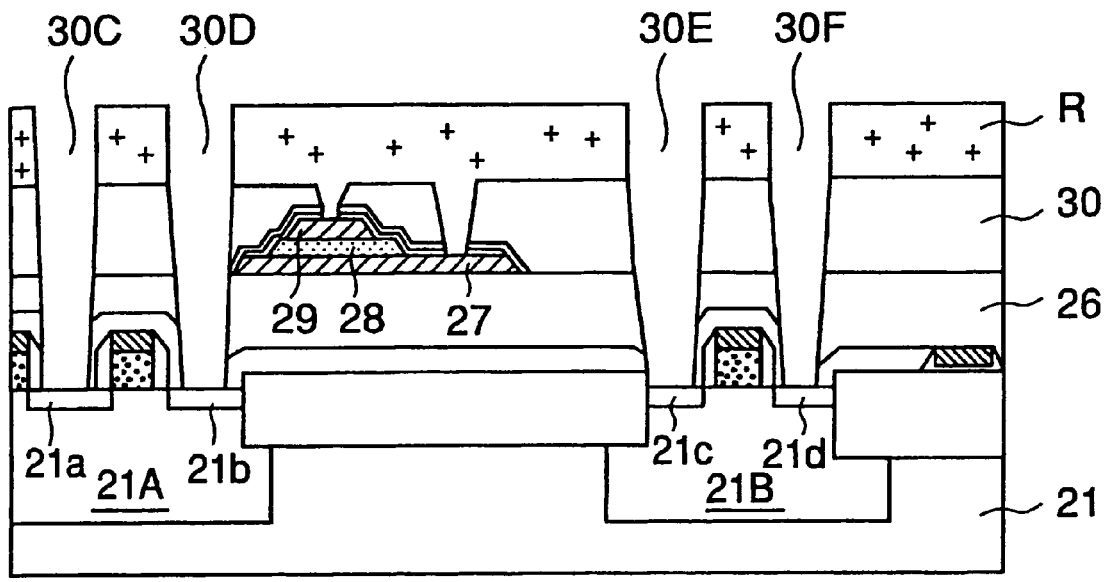
Figure 2D:
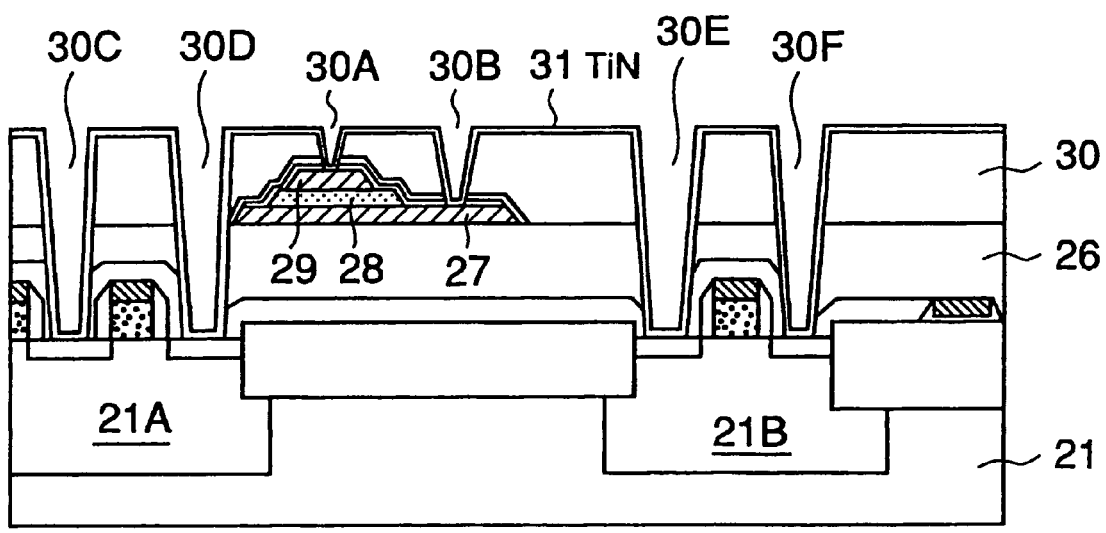
Figure 2E:
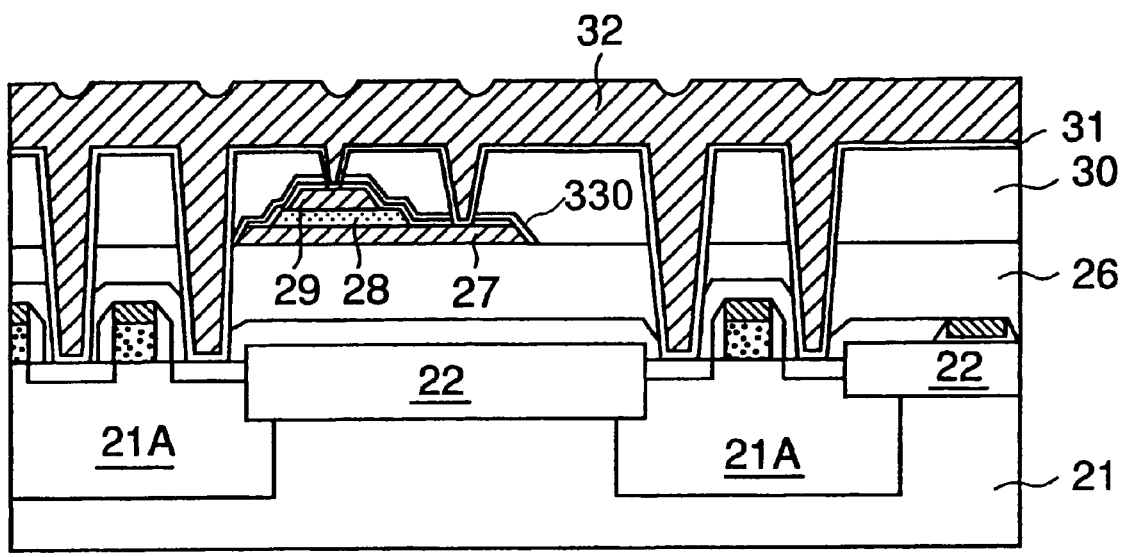
Figure 2F:
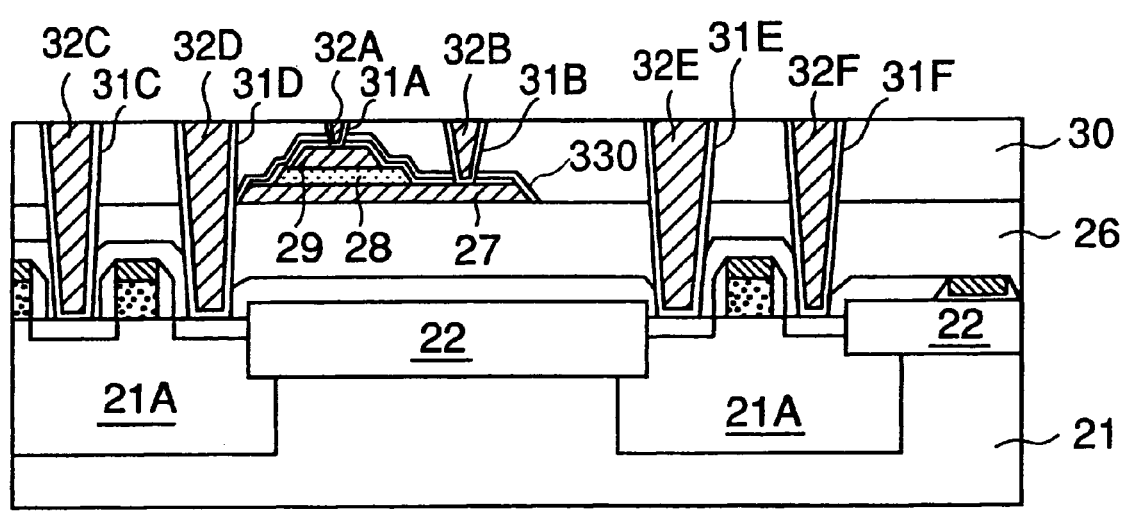
Figure 3:
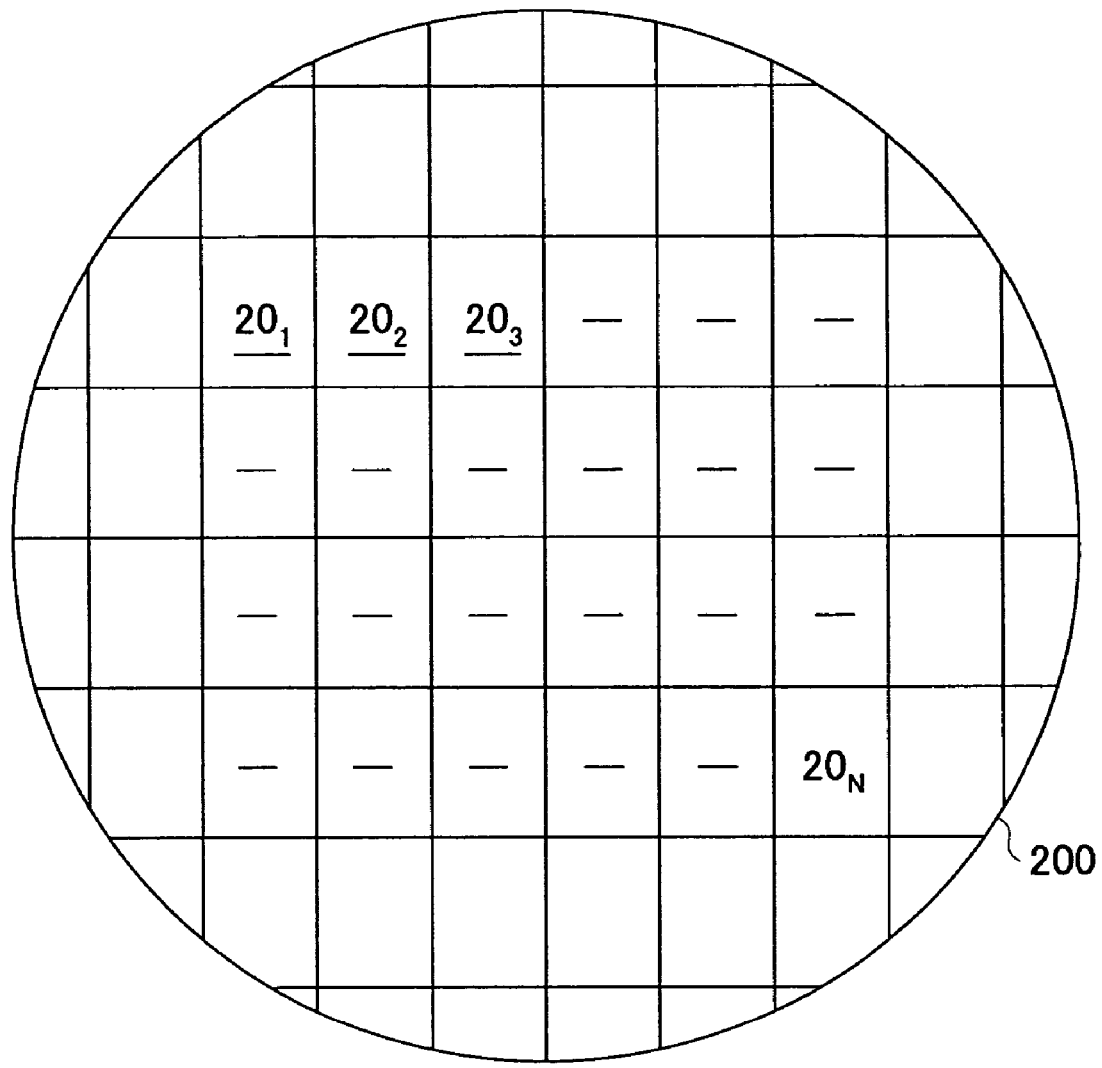
FIG. 3 is a diagram showing a semiconductor wafer including chip regions of FeRAM in a plan view.

The present invention carries out polishing of an interlayer insulation film covering the ferroelectric capacitors on the semiconductor wafer 100 by a CMP process corresponding to the step of FIG. 2A while using at least two, different film-thickness monitoring patterns A and B disposed on the scribe line 101 for the purpose of controlling the film thickness of the interlayer insulation film in the state after the polishing step.

FIG. 7 is a cross-sectional diagram showing the principle of the film-thickness monitoring patterns A and B.

Referring to FIG. 7, each of the film-thickness monitoring patterns A and B comprises a metal pattern having a flat surface and preferably high reflectivity, and the thickness of the interlayer insulation film 30 remaining on the film-thickness monitoring pattern is measured by using interference of a reflection light reflected from the film-thickness monitoring pattern A or B and the reflection light reflected from the surface of the interlayer insulation film 30. Typically, the film-thickness monitoring patterns A and B have a rectangular shape in a plan view.

Figure 8B:
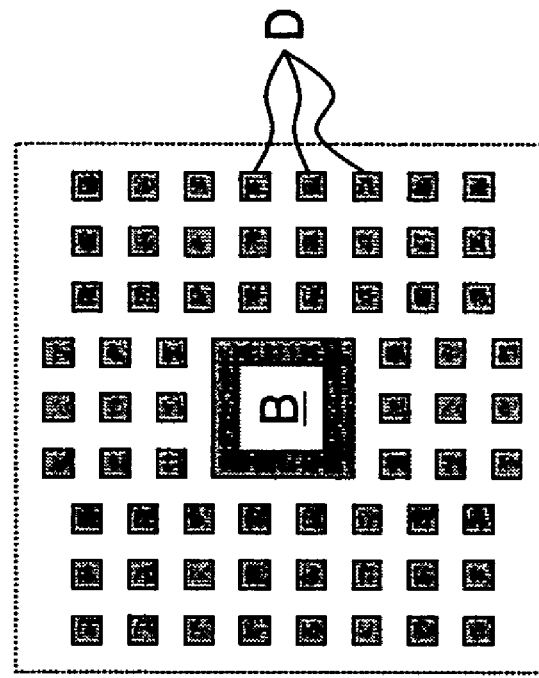
FIGS. 8A and 8B are plan view diagrams explaining the film-thickness monitoring pattern of FIG. 6.
Figure 8A:
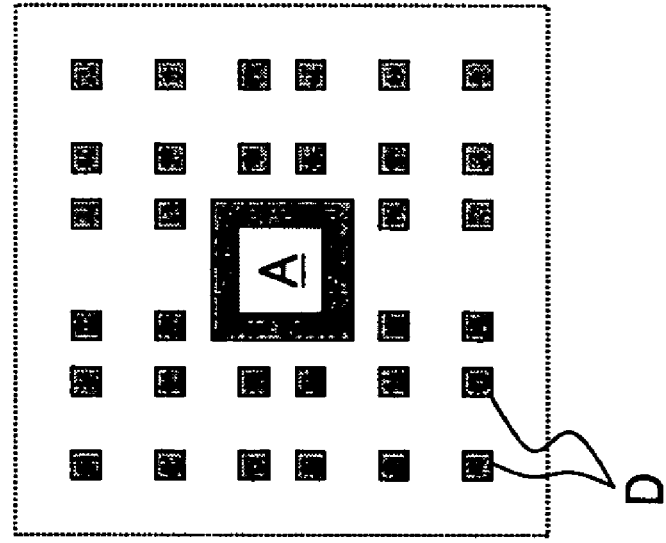

As explained previously, the film-thickness monitoring patterns A and B are deposed at suitable locations on the scribe lines 101 automatically at the time of designing the semiconductor device, wherein the present embodiment disposes a large number of dummy patterns D around each of the film-thickness monitoring patterns A and B as represented in FIGS. 8A and 8B, and with this, the area occupation ratio including the dummy patterns is changed between the pattern A and the pattern B.

In the example of FIG. 8A, for example, the area occupation ratio is set to 30% for the film-thickness monitoring pattern A, while the area occupation ratio for the film-thickness monitoring pattern B is set to 80% in the example of FIG. 8B. Here, it should be noted that each of the dummy patterns D has an area much smaller than the film-thickness monitoring patterns A and B and can be disposed as desired on the scribe line 101 for realizing the desired area occupation ratio. Alternatively, it is possible to assign a function to the patterns D by forming the same with a larger area.

Thus, in the case of polishing a semiconductor substrate carrying thereon the two film-thickness monitoring patterns A and B of different area occupation ratios by a CMP process, the interlayer insulation film 30 remaining on the film-thickness monitoring pattern A has a reduced film thickness in correspondence to the smaller area occupation ratio of 30%, while the interlayer insulate film 30 remaining on the film-thickness monitoring pattern B has an increased film thickness after the CMP process.

Thus, by measuring the thickness of the interlayer insulation film 30 by using the film-thickness monitoring patterns A and B at the time of the CMP process in such a case in which the ferroelectric capacitors are formed on the wafer 100 with various area occupation ratios between the minimum ratio of 30% and the maximum ratio of 80%, it becomes possible to avoid the state I shown in FIG. 9 in which the interlayer insulation film 30 has an acceptable thickness only for the film-thickness monitoring pattern A (insufficient polishing) or the state III in which the interlayer insulation film has an acceptable thickness only for the film-thickness monitoring pattern B (excessive polishing), and it becomes possible to ensure the state II shown in FIG. 9 in which the median value of the film thickness takes the value of about 0.9 μm and the film thickness of the interlayer insulation film 30 falls within the allowable range for any of the film-thickness monitoring patterns A and B.

With the present invention, it should be noted that there is no need of disposing the film-thickness monitoring pattern A in the vicinity of the chip region where the area occupation ratio of the ferroelectric capacitors is 30% and disposing the film-thickness monitoring pattern B in the vicinity of the chip region where the area occupation ratio of the ferroelectric capacitors is 80%. Thus, no excessive restriction is imposed at the time of designing of the semiconductor device.

Figure 10:
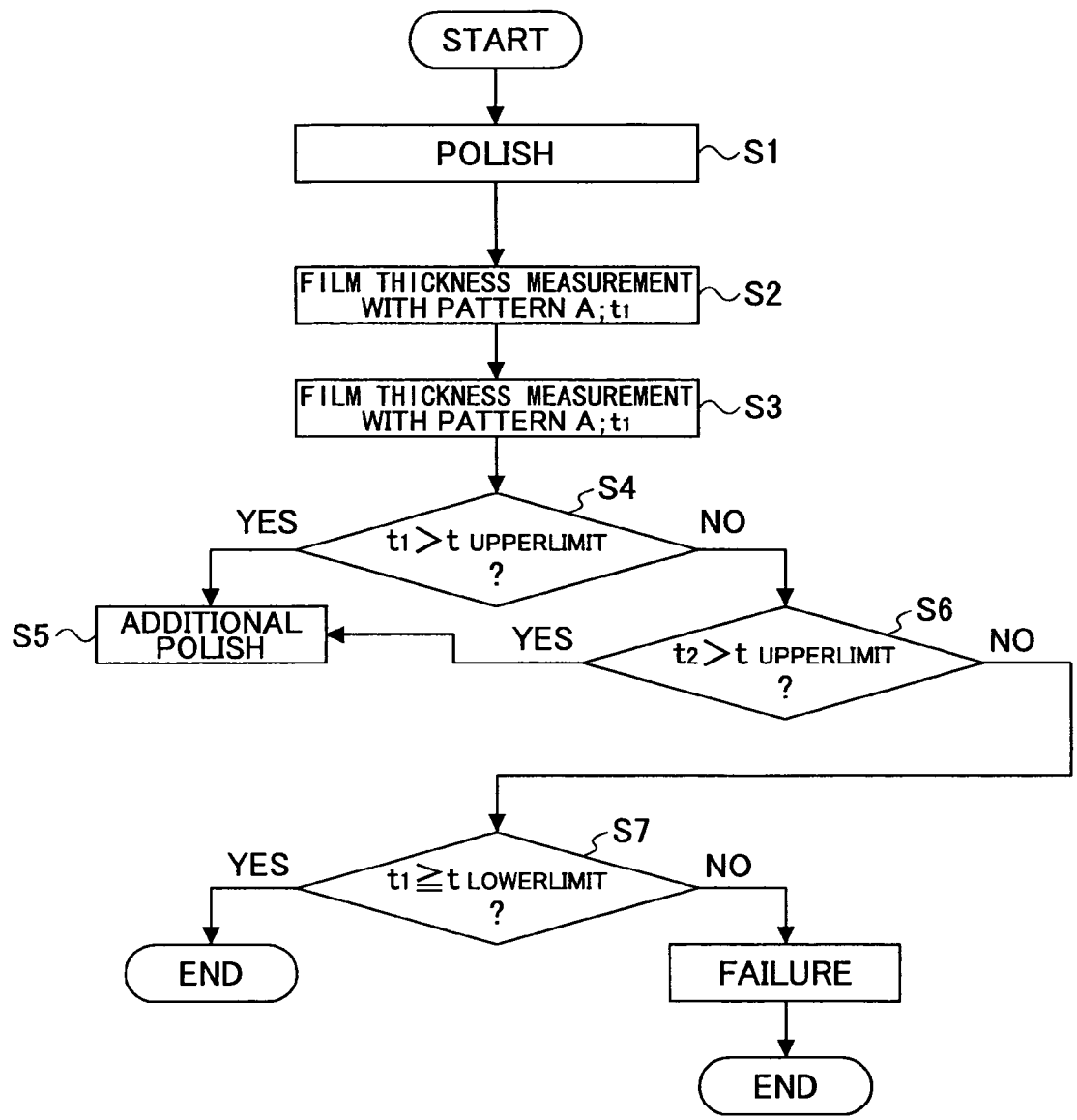
FIG. 10 is a flowchart showing the optimization process of FIG. 9.

FIG. 10 shows the flowchart of the CMP process corresponding to FIG. 9.

Referring to FIG. 10, the interlayer insulation film 30 is polished first in the step 1, followed by measurement of the film thickness t1 of the interlayer insulation film 30 in the step 2 by using the film-thickness monitoring pattern A.

Next, in the step 3, the thickness t2 (t2>t1) of the interlayer insulation film 30 is measured by using the thickness monitoring pattern B, and in the step 4, it is judged whether or not the thickness t1 has exceeded a predetermined upper limit thickness $t_{upperlimit}$.

If the result of the step 4 is YES, this means that the film thickness of the interlayer insulation film 30 does not reach the desired upper limit thickness in the part where the film thickness is the smallest and additional polishing is conducted in the step S5. After the polishing of the step 5, the process returns to the step 2.

When the result of judgment of the step 4 is NO, this means that the film thickness of the interlayer insulation film 30 has become smaller than the desired upper limit thickness at least in the part where the film thickness is the smallest, and judgment is made in the step 6 whether or not the foregoing film thickness t2 exceeds the desired upper limit thickness.

If the result of judgment of the step 6 is YES, additional polishing is conducted in the step 5 and the process returns to the step 2.

On the other hand, when the result of judgment of the step 6 is NO, this means that the maximum thickness of the interlayer insulation film 30 has become smaller than the desired upper limit thickness, and the step 7 is conducted in the next, wherein it is examined whether or not the thickness t1 equal to or larger than a predetermined lower limit thickness $t_{lowerlimit}$.

If the result of the judgment of the step 7 is YES, the polishing for that wafer is finished.

In the case the result of the step 7 is NO, this means that the polishing has failed, while with the present embodiment, it is actually possible to avoid such failure of polishing in the step 7, by setting the range of the area occupation ratio of the ferroelectric capacitors suitably at the time of designing of the semiconductor device in correspondence to the allowable range of FIG. 9.

By using the process shown in FIG. 10, it becomes possible to avoid the failure of polishing as in the case of the state I, in which the polishing is controlled only by using the film-thickness monitoring pattern A, or the failure of polishing as I the case of the state III, in which the polishing is controlled only by using the film-thickness monitoring pattern B, and it becomes possible to improve the yield of production of the semiconductor devices.

Second Embodiment

Figure 11:
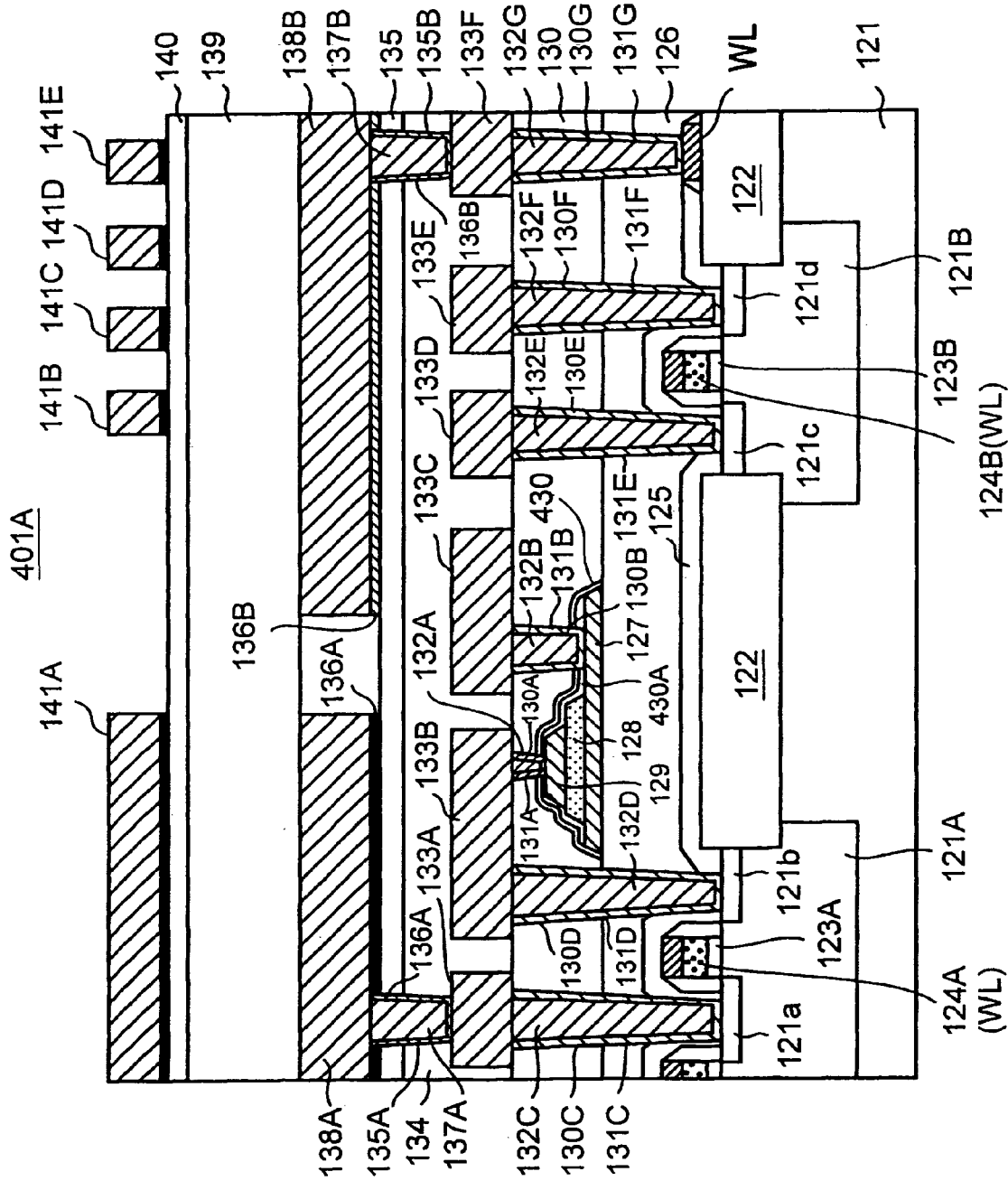
FIG. 11 is a diagram showing the construction of an FeRAM according to a second embodiment of the present invention in a cross-sectional view.

FIG. 11 shows the construction of an FeRAM according to a second embodiment of the present invention formed on a device region 401A.

Referring to FIG. 11, the FeRAM has a construction similar to that of the FeRAM 20 of FIG. 1 and is formed on a silicon substrate 121 of p-type or n-type formed with a p-type well 121A and an n-type well 121B by a field insulation film 122, wherein a gate electrode 124A of polycide structure is formed on the p-type well 121A via a gate insulation film 123A. Further, a gate electrode 124B of polycide structure is formed on the n-type well 121B via a gate insulation film 123B.

Further, there are formed n-type diffusion regions 121a and 121b in the p-type well 121A at respective lateral sides of the gate electrode 124A, while there are formed p-type diffusion regions 121c and 121d in the n-type well 121B at respective lateral sides of the gate electrode 124B. The gate electrode 124A extends over the field oxide film 122 in the region outside the active region and forms a part of the word line (WL) of the FeRAM.

Each of the gate electrodes 124A and 124B carries respective sidewall insulation films and is covered by an SiON cover film 125 having a thickness of about 200 nm, wherein the SiON cover film 125 may be formed on the Si substrate 121 by a CVD process so as to cover the field insulation film 122.

The cover film 125 is further covered by an $SiO_2$ interlayer insulation film 126 formed by a CVD process with the thickness of about 1 μm while using a TEOS gas as the source, and the surface of the interlayer insulation film 126 is planarized by a CMP process.

On the planarized surface of the interlayer insulation film 126, there is formed a ferroelectric capacitor having a construction in which a lower electrode 127, formed of lamination of a Ti film having a thickness of 10-30 nm, preferably about 20 nm and a Pt film having a thickness of 100-300 nm, preferably about 175 nm, a ferroelectric capacitor insulation film 128 of PZT ($Pb(Zr,Ti)O_3$) or PLZT (($Pb,La)(Zr,Ti)O_3$) having a thickness of 100-300 nm, preferably about 240 nm, and an upper electrode 129 of IrOx having a thickness of 100-300 nm, preferably about 200 nm, are stacked consecutively.

Typically, the Ti film and the Pt film are formed by a sputtering process, while the ferroelectric capacitor insulation film 128 is formed by a sputtering process, followed by a rapid thermal annealing process conducted in an oxygen gas ambient at 725° C. for 20 seconds.

Preferably, the ferroelectric film 128 is added with Ca and Sr and may be formed also by processes other than sputtering, such as spin-on process, sol-gel process, MOD (metal organic deposition) process, MOCVD process, or the like. Further, for the ferroelectric capacitor insulation film 128, it is possible to use, in addition to PZT or PLZT, the films of SBT ($SrBi_2(Ta,Nb)_2O_9$), BTO ($Bi_4Ti_2O_{12}$), and the like. Further, it is possible to form a DRAM is as well by using a high-K dielectric film such as BST (($Ba,Sr)TiO_3$) or STO ($SrTiO_3$) in place of the ferroelectric capacitor insulation film 128. Typically, the IrOx film forming the upper electrode 129 is formed by sputtering. Further, it is possible to use a Pt film or an SRO ($SrRuO_3$) film for the upper electrode 129 in place of the IrOx film.

Meanwhile, with the ferroelectric capacitor thus formed, there easily occurs reduction in the ferroelectric capacitor insulation film 128 when the ferroelectric capacitor insulation film is exposed to a reducing ambient, especially a hydrogen gas ambient associated with semiconductor process. Thereby, there is caused sever deterioration in the electric performance.

Because of this, the ferroelectric capacitor thus formed is covered by an encap layer 430A of $Al_2O_3$ of the thickness of about 50 nm formed by sputtering at an ordinary temperature. Further, the encap layer 430A is covered by another $Al_2O_3$ encap layer 430 formed on the interlayer insulation film 26 by sputtering with the thickness of about 20 nm. Here, it should be noted that the $Al_2O_3$ encap layer 430 functions as a barrier film that prevents penetration of hydrogen.

On the encap layer 430, there is formed an $SiO_2$ interlayer insulation film 130 by a CVD process, preferably plasma CVD process, while using $SiH_4$, a polysilane compound such as $Si_2F_6$, $Si_3F_8$, $Si_2F_3Cl$, or the like, or $SiF_4$ or TEOS for the source material, with a thickness of about 400 nm over the upper electrode 129.

In the interlayer insulation film 130, there are formed contact holes 130A and 130B exposing the upper electrode 129 and the lower electrode 127 respectively. Further, there are formed contact holes 130C, 130D, 130E and 130F respectively exposing the diffusion regions 121a, 121b, 121c and 121d such that the contact holes 130C, 130D, 130E and 130F extend through the interlayer insulation film 126. Further, there is formed a contact hole 130G in the interlayer insulation film 130 so as to expose the word line pattern WL formed on the device isolation film 122.

With the FeRAM of FIG. 11, there are formed adhesion films 131A and 131B of a conductive nitride such as TiN respectively in the contact holes 130A and 130B with a thickness of about 50 nm so as to make a direct contact with the inner wall surface of the respective contact holes and so as to make a direct contact with the exposed surface of the upper electrode 129 or the lower electrode 127.

Further, in the contact hole 130A, there is formed a conductive plug 132A of W on the TiN adhesion layer 131A, and in the contact hole 130B, there is formed a conductive plug 132B of W on the TiN adhesion layer 131B, wherein the conductive plugs 132A and 132B are formed by a CVD process that uses a mixed gats of $WF_6$, Ar and $H_2$.

Further, with the FeRAM of the present embodiment, there are formed Ti/TiN adhesion layers 311C-131G on the inner wall surfaces of the contact holes 130C-130G, respectively, and the W plugs 132C-132G are formed respectively on the Ti/TiN adhesion layers 131C-131G so as to fill the respective contact holes.

Further, there are formed interconnection patterns 133A-133F of Al on the interlayer insulation film 130 respectively in correspondence to the W plugs 132A-132G, wherein the interconnection patterns 133A-133F are covered by a next interlayer insulation film 134 of an $SiO_2$ film formed by a plasma CVD process. Similarly to the interlayer insulation film 130, the interlayer insulation film 134 can be formed by using $SiH_4$, a polysilane compound of $Si_2F_6$, $Si_3F_8$, $Si_2F_3Cl$, and the like, or $SiF_4$, or TEOS as a source material.

Further, a protective insulation film 135 of $SiO_2$ is formed on the interlayer insulation film 134 by a plasma CVD process with the thickness of 100 nm or more. The protective insulation film 135 thus covers a slit (void) exposed by the planarization process (CMP) conducted after the formation of the interlayer insulation film 134.

Further, contact holes 135A and 135B are formed in the protective insulation film 135 to as to penetrate through the interlayer insulation film 134 and expose the interconnection patterns 133A and 133F respectively, and W plugs 137A and 137B are formed on the inner wall surfaces of the contact holes 135A and 135B through the TiN adhesive layers 136A and 136B.

Further, interconnection patterns 138A and 138B of Al or Al alloy are formed on the protective insulation film 135 respectively in contact with the W plugs 137A and 137B. Thereby, the TiN adhesion films 136A and 136B, covering the inner wall surfaces of the contact holes 135A and 135B, extend further between the protective insulation film 135 and the interconnection pattern 138A and or 138B and between the protective insulation film 135 and the interconnection pattern 138B.

Further, the interconnection patterns 138A and 138B are covered by an interlayer insulation film 139 formed similarly to the interlayer insulation films 130 and 134, wherein the interlayer insulation film is covered by a protective insulation film 140 similar to the protective insulation film 135 and interconnection patterns 141A-141E including therein a bit line (BL) pattern are formed on the protective film 140.

Hereinafter, the fabrication process of the FeRAM of FIG. 11 will be explained with reference to FIGS. 12A-12I in relation to the formation of the film-thickness monitoring patterns in a scribe region 401B.

Figure 12A:
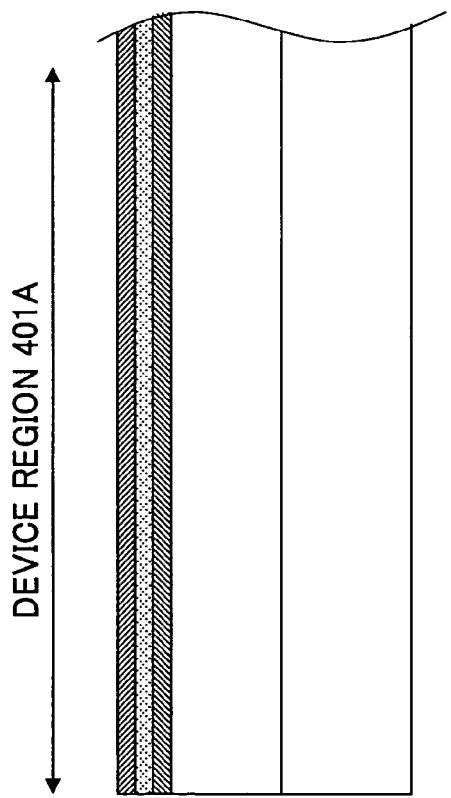

Referring to FIG. 12A, the silicon substrate 121 is covered with the interlayer insulation film 126, and a conductor film 127A forming the lower electrode 127, a ferroelectric film 128A forming the ferroelectric capacitor insulation film 128, and a conductor film 129A forming the upper electrode 129 are formed on the interlayer insulation film 129 uniformly so as to cover the device region 401A and further the scribe region 401B.

Figure 12B:
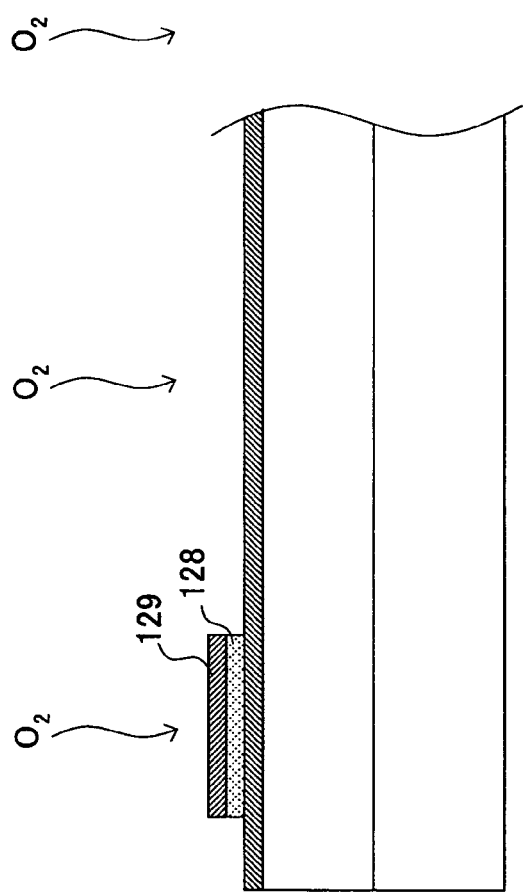

Next, in the step of FIG. 12B, the conductor film 129A and the underlying ferroelectric film 128A are patterned consecutively, and thus, there are formed a large number of structures each including the lamination of the ferroelectric capacitor insulation film 128 and the upper electrode 129 on the device region 401A with a predetermined area occupation ratio. Thereby, it should be noted that there are formed plural memory cell arrays of respective, mutually different area occupation ratios on the substrate 121 in the manner separated by the scribe regions 401B as explained with reference to FIG. 6.

Further, in the step of FIG. 12B, a conductor pattern 129B of high reflectivity is formed in the scribe region 401B simultaneously to the patterning of the ferroelectric film 129A with the same composition and same thickness to those of the upper electrode 129. Further, as a result of patterning of the ferroelectric film 128A, there is formed a ferroelectric pattern 128B underneath the conductor pattern 129B simultaneously to the ferroelectric capacitor insulation film 128.

The structure of FIG. 12B is further annealed in an oxygen gas ambient and the oxygen defects introduced into the capacitor insulation film 128 are compensated for.

In the step of FIG. 12B, it should be noted that the patterning of the upper electrode 129 and the conductor pattern 129B is conducted by using the same mask pattern, while the patterning of the ferroelectric capacitor insulation film 128 and the ferroelectric pattern 128B are conducted by using the same mask pattern.

While not illustrated, it should be noted that there are formed dummy conductor patterns around the conductor pattern 129B formed in the scribe region 401B similarly to the dummy patterns D of FIGS. 8A and 8B, such that the area occupation ratio thereof including the conductor pattern 129B is identical to the area occupation ratio of the upper electrodes 129. With the present embodiment, there are formed two different film-thickness monitoring patterns having respective, different area occupation ratios on the scribe region 401B.

Figure 12C:
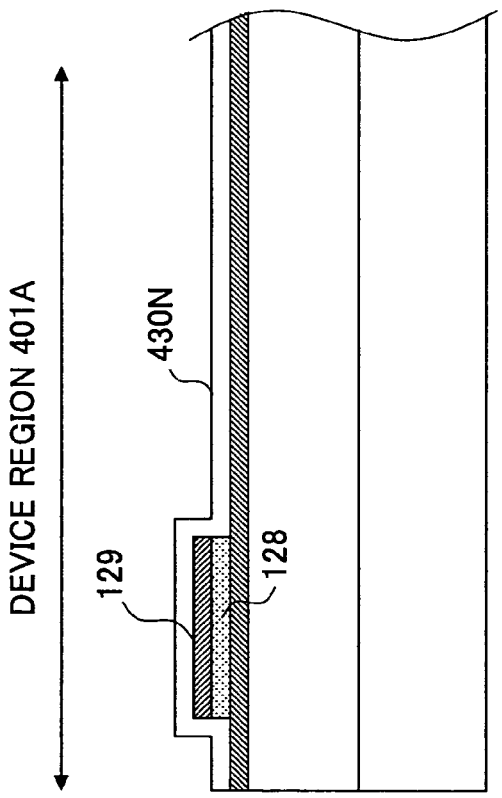
Figure 12D:
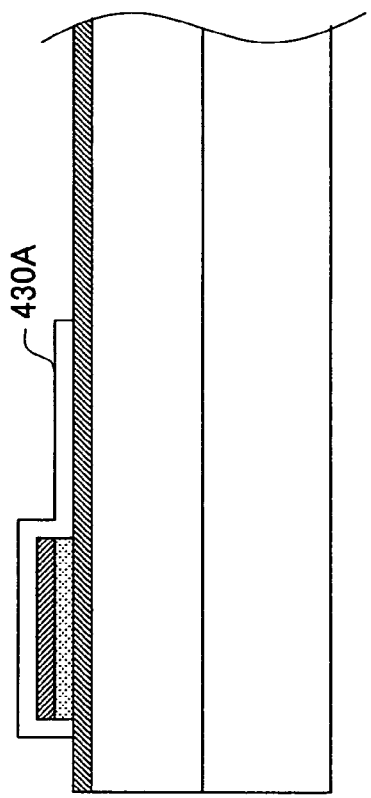

Further, in the step of FIG. 12C, an $Al_2O_3$ film 430N constituting the encap layer 430A is formed on the structure of FIG. 12B so as to cover the device region 401A and the scribe region 401B uniformly with a thickness of 50 nm, for example, Next, in the step of FIG. 12D, the $Al_2O_3$ film 430N is patterned such that the $Al_2O_3$ film 430N remains solely in the regions where the ferroelectric capacitors are formed as the encap layer 403A.

Further, in the step of FIG. 12E, the conductive film 127A is patterned and the lower electrode layer 127 is formed, and with this, ferroelectric capacitors FC having the lower electrode layer 127 are formed in the device region 401A. At the same time, the conductor pattern 127A is formed in the scribe region 401B, wherein the conductor pattern 127A, the ferroelectric pattern 128B and the conductor pattern 129B form a film-thickness monitoring pattern 127M in the scribe region 401B. Here, it should be noted that the patterning of the lower electrode 127 and the conductor pattern 127B are conducted while using the same mask pattern.

As already noted before, there are formed a large number of dummy patterns in the vicinity of the monitor pattern 127M similarly to the case of FIGS. 8A and 8B with the area occupation ratio corresponding to the area occupation ratio of the ferroelectric capacitors FC. Preferably, these dummy patterns are formed simultaneously to the formation of the ferroelectric capacitors FC. In such a case, each dummy pattern has a layer structure identical to that of the ferroelectric capacitor FC.

Next, in the step of FIG. 12F, an $Al_2O_3$ film 430M corresponding to the encap layer 430 is formed on the structure of FIG. 12E so as to cover the device region 410A and the scribe region 401B uniformly with the thickness of 100 nm, for example, wherein the second encap layer 430 is formed in the step of FIG. 12G by patterning the $Al_2O_3$ film 430M such that the encap layer 430 covers each ferroelectric capacitor FC via the $Al_2O_3$ encap layer 430A. As a result of the process of FIG. 12G, it will be noted that the film-thickness monitoring pattern 12M, hitherto covered by the $Al_2O_3$ film 430M, is exposed in the scribe region 401B.

Next, in the step of FIG. 12H, the next interlayer insulation film 130 is formed on the interlayer insulation film 126 with the thickness of 1.6 µm, for example, and with this, the thickness of the interlayer insulation film 130 is reduced by a CMP process to the desired film thickness range of 0.9±0.1 µm.

With the present embodiment, the CMP process of FIG. 12H is conducted while using two such film-thickness monitoring patterns 127M of different area occupation ratios, and the CMP process is optimized in accordance with the flowchart of FIG. 10. Thereby, the thickness of the interlayer insulation film 130 after the polishing process is set to the range of 0.9±0.1 µm over the entire substrate 121, and hence over the entire wafer.

Next, in the step of FIG. 12I, the interlayer insulation film 130 is formed with the contact holes 130A and 130B in the device region 401A by conducting a photolithographic process and dry etching process such that the contact holes 130A and 130B extend through the $Al_2O_3$ encap layers 430 and 430A so as to expose the upper electrode 129 and the lower electrode 127.

Further, in the step of FIG. 12J, a TiN film is deposited on the structure of FIG. 12I by a sputtering process as an adhesion layer, followed by deposition of a W layer thereon by a CVD process that uses $WF_6$ as the gaseous source, such that the contact holes 130A and 130B and an alignment opening 130m are filled with a W film via the foregoing TiN adhesion layer.

Further, excessive TiN film and W film remaining on the interlayer insulation film 130 is removed by a CMP process, and with this, there is obtained a structure shown in FIG. 12J in which the contact hole 130A is filled with the W plug 132A via the TiN adhesion film 131A.

Heretofore, the present invention has been explained for the example of fabricating an FeRAM including a planarization step of an interlayer insulation film covering the ferroelectric capacitors, while the present invention is by no means limited to such a specific example and it is possible to apply the present invention to general fabrication of a semiconductor device or an electron device that includes therein a stepped part.

Thus, various variations and modifications may be made within the scope of the present invention recited in the claims.

For example, it is possible to control the film thickness of the interlayer insulation film to a desired range in the state II of the optimization step of FIG. 9 by using the film-thickness monitoring pattern B alone, provided that the film thickness of the interlayer insulation film obtained by the film-thickness monitoring pattern and the film thickness of the interlayer insulation film obtained by the film-thickness monitoring pattern A are known either empirically or theoretically. Thus, the present invention includes also such a case.

In such a case, it is necessary to form the dummy patterns around the film-thickness monitoring pattern B with the area occupation ratio set equal to the area occupation ratio of the region where the ferroelectric capacitors are formed most densely on the substrate. In such a case, it is possible to control the film thickness of the interlayer insulation film within the allowable range over the entire substrate by stopping the CMP process at the moment the thickness of the interlayer insulation film obtained by the film-thickness monitoring pattern B has reached the upper allowable limit thickness.

Further, it is also possible with the present invention to control the film thickness of the interlayer insulation film in the state II of the optimization step of FIG. 9 while using the film-thickness monitoring pattern A alone. Thus, the present invention also includes such a case.

In this latter case, the dummy patterns are formed around the film-thickness monitoring pattern A with the area occupation ratio of the region where the ferroelectric capacitors are formed most sparsely on the substrate. In such a case, it becomes possible to control the film thickness of the interlayer insulation film within the allowable range throughout the substrate, by stopping the CMP process immediately before the film thickness of the interlayer insulation film obtained by the film-thickness monitoring pattern A has reached the allowable lower limit thickness.

According t the present invention, it becomes possible to control the film thickness of the interlayer insulation film after the polishing step in the fabrication process of a semiconductor device, the semiconductor device including therein plural stepped structures with different area occupation rates, by conducting measurement of film thickness of the interlayer insulation film covering these stepped structures while using at least two film-thickness monitoring patterns.

What is claimed is:

1. A semiconductor substrate, comprising:
a wafer;
a first stepped structure comprising plural stepped parts formed on a surface of said wafer with a first area occupation ratio;
a second stepped structure comprising plural stepped parts formed on said surface of said wafer with a second, different area occupation ratio; and
an interlayer insulation film formed on said surface so as to cover said first and second stepped structures, said interlayer insulation film having a planarized top surface,
wherein at least first and second film-thickness monitoring patterns for monitoring film thickness on said surface are provided in a manner covered by said interlayer insulation film,
a first pattern group including plural patterns is formed on said surface so as to surround said first film-thickness monitoring pattern,
a second pattern group including plural patterns is formed on said surface so as to surround said second film-thickness monitoring pattern,
said first film-thickness monitoring pattern and said first pattern group having a third area occupation ratio on said surface, while said second film-thickness monitoring pattern and said second pattern group having a fourth area occupation ratio on said surface,
wherein said third area occupation ratio is different from said fourth area occupation ratio,
wherein said third area occupation ratio is set substantially equal to said first area occupation ratio, and wherein said fourth area occupation ratio is set substantially equal to said second area occupation ratio.

2. The semiconductor substrate as claimed in claim 1, wherein said first and second stepped structures include a ferroelectric capacitor for respective stepped parts.

3. The semiconductor substrate as claimed in claim 1, wherein each of said patterns constituting said first pattern group has an area smaller than said first film-thickness monitoring pattern, and wherein each of said patterns constituting said second pattern group has an area smaller than said second film-thickness monitoring pattern.

4. The semiconductor substrate as claimed in claim 1, wherein there is further formed on said surface a third stepped structure with an area occupation ratio intermediate between said first and second area occupation ratios.

5. A semiconductor substrate, comprising:
a wafer;
a first stepped structure comprising plural stepped parts formed on a surface of said wafer with a first area occupation ratio;
a second stepped structure comprising plural stepped parts formed on said surface of said wafer with a second, different area occupation ratio; and
an interlayer insulation film formed on said surface so as to cover said first and second stepped structures, said interlayer insulation film having a planarized top surface,
wherein at least first and second film-thickness monitoring patterns for monitoring film thickness on said surface are provided in a manner covered by said interlayer insulation film,
a first pattern group including plural patterns is formed on said surface so as to surround said first film-thickness monitoring pattern,
a second pattern group including plural patterns is formed on said surface so as to surround said second film-thickness monitoring pattern,
said first film-thickness monitoring pattern and said first pattern group having a third area occupation ratio on said surface, while said second film-thickness monitoring pattern and said second pattern group having a fourth area occupation ratio on said surface,
wherein said third area occupation ratio is different from said fourth area occupation ratio,
wherein said first and second stepped structures are separated from each other on said substrate by a scribe region, said first film-thickness monitoring pattern and said first pattern group are formed in said scribe region, and said second film-thickness monitoring pattern and said second pattern group are formed in said scribe region.

6. A semiconductor substrate, comprising:
a wafer;
a first stepped structure comprising plural steed parts formed on a surface of said wafer with a first area occupation ratio;
a second stepped structure comprising plural stepped parts formed on said surface of said wafer with a second, different area occupation ratio; and an interlayer insulation film formed on said surface so as to cover said first and second stepped structures, said interlayer insulation film having a planarized top surface, wherein at least first and second film-thickness monitoring patterns for monitoring film thickness on said surface are provided in a manner covered by said interlayer insulation film, a first pattern group including plural patterns is formed on said surface so as to surround said first film-thickness monitoring pattern, a second pattern group including plural patterns is formed on said surface so as to surround said second film-thickness monitoring pattern, said first film-thickness monitoring pattern and said first pattern group having a third area occupation ratio on said surface, while said second film-thickness monitoring pattern and said second pattern group having a fourth area occupation ratio on said surface, wherein said third area occupation ratio is different from said fourth area occupation ratio, wherein said first and second stepped structures have a substantially identical layer structure, and wherein said first and second film-thickness monitoring patterns and each of said patterns constituting said first and second pattern groups have a layered structure substantially identical to said layered structure of said first and second stepped structures.

* * * * *